United States Patent
Nadjar et al.

(10) Patent No.: US 8,280,065 B2
(45) Date of Patent: Oct. 2, 2012

(54) METHOD AND SYSTEM FOR ACTIVE NOISE CANCELLATION

(75) Inventors: Hamid Sheikhzadeh Nadjar, Waterloo (CA); Todd Schneider, Waterloo (CA); Robert L. Brennan, Kitchener (CA)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1791 days.

(21) Appl. No.: 11/173,355

(22) Filed: Jul. 1, 2005

(65) Prior Publication Data

US 2006/0069556 A1 Mar. 30, 2006

(30) Foreign Application Priority Data

Sep. 15, 2004 (CA) ..................................... 2481629

(51) Int. Cl.
 *A61F 11/06* (2006.01)
(52) U.S. Cl. .................. 381/71.1; 381/71.8; 381/71.11; 381/71.12
(58) Field of Classification Search ...... 381/71.1–71.14, 381/94.1–94.9, 312–317; 379/406.01–406.16; 704/226–229, 233
 See application file for complete search history.

(56) References Cited

U.S. PATENT DOCUMENTS

| | | | |
|---|---|---|---|
| 2,481,629 A | 9/1949 | Thieme | |
| 4,965,832 A | 10/1990 | Edwards et al. | |
| 5,016,271 A * | 5/1991 | Ford | 379/406.15 |
| 5,329,587 A * | 7/1994 | Morgan et al. | 379/406.09 |
| 5,440,642 A * | 8/1995 | Denenberg et al. | 381/71.13 |
| 5,475,761 A | 12/1995 | Eatwell | |
| 5,487,027 A | 1/1996 | Heath et al. | |
| 5,652,770 A | 7/1997 | Eatwell | |
| 5,699,436 A | 12/1997 | Claybaugh et al. | |
| 5,815,582 A | 9/1998 | Claybaugh et al. | |
| 5,940,519 A | 8/1999 | Kuo | |
| 5,991,418 A | 11/1999 | Kuo | |
| 6,058,194 A | 5/2000 | Gulli et al. | |
| 6,061,456 A | 5/2000 | Andrea et al. | |
| 6,069,959 A | 5/2000 | Jones | |
| 6,078,672 A | 6/2000 | Saunders et al. | |
| 6,115,478 A | 9/2000 | Schneider | |
| 6,118,878 A | 9/2000 | Jones | |
| 6,160,893 A | 12/2000 | Saunders et al. | |
| 6,163,610 A | 12/2000 | Bartlett et al. | |
| 6,236,731 B1 * | 5/2001 | Brennan et al. | 381/316 |
| 6,240,192 B1 | 5/2001 | Brennan et al. | |
| 6,278,786 B1 | 8/2001 | McIntosh | |
| 6,396,930 B1 | 5/2002 | Vaudrey et al. | |
| 6,412,593 B1 | 7/2002 | Jones | |
| 6,418,227 B1 | 7/2002 | Kuo | |
| 6,445,799 B1 | 9/2002 | Taenzer et al. | |

(Continued)

OTHER PUBLICATIONS

Title: A delayless Subband Adaptive Filter Architecture Author: Morgan, Dennis Journal: IEEE Transactions on Signal Processing vol. 43 No. 8 Aug. 1995.*

(Continued)

*Primary Examiner* — Vivian Chin
*Assistant Examiner* — Fatimat O Olaniran
(74) *Attorney, Agent, or Firm* — Pearne & Gordon LLP

(57) ABSTRACT

A method and system for active noise cancellation is provided. The system employs subband processing, and preferably implements over-sampled filterbank. The system is applicable to adaptive noise cancellation, adaptive echo cancellation for portable listening devices, such as headsets and other similar listening devices.

25 Claims, 35 Drawing Sheets

U.S. PATENT DOCUMENTS

| | | | |
|---|---|---|---|
| 6,463,316 | B1 | 10/2002 | Brungart |
| 6,606,391 | B2 * | 8/2003 | Brennan et al. ............... 381/316 |
| 6,661,895 | B1 | 12/2003 | Wong et al. |
| 7,050,966 | B2 * | 5/2006 | Schneider et al. ......... 704/200.1 |
| 7,110,554 | B2 * | 9/2006 | Brennan et al. .............. 381/94.7 |
| 7,359,520 | B2 * | 4/2008 | Brennan et al. ................. 381/92 |
| 7,783,032 | B2 * | 8/2010 | Abutalebi et al. ........ 379/406.09 |
| 2003/0108214 | A1 | 6/2003 | Brennan et al. |
| 2003/0198357 | A1 | 10/2003 | Schneider et al. |
| 2004/0037430 | A1 | 2/2004 | Kim |
| 2004/0071284 | A1 | 4/2004 | Abutalebi et al. |

OTHER PUBLICATIONS

Morgan, et al., "A delayless subband adaptive filter structure", IEEE Trans. on Signal Proc., vol. 43, pp. 1819-1830, Aug. 1995.

J. Huo, et al., "New weight transform schemes for delayless subband adaptive filetering", Proc. of IEEE Global Telecom. Conf., pp. 197-201, 2001.

L. Larson, et al., "A new subband weight transform for delayless subband adaptive filtering structures", Proc. of IEEE DSP Workshop, pp. 201-206, 2002.

N. Hirayama and H. Sakai, "Analysis of a delayless subband adaptive filter", Proc. ofICASSP, pp. 2329-2332, 1997.

N. Hirayama, et al."Delayless subband adaptive filtering using the hadamard transform", IEEE Trans. on signal Proc., vol. 47, No. 6, pp. 1731-1734, Jun. 1999.

R. Merched, et al.,"A delayless alias-free subband adaptive filter structure", Proc. of IEEE Int. Symp. on Circuits and Systems, pp. 2329-2332, Jun. 9-12, 1997.

P. S. R. Diniz, et al., "Analysis of a delayless subband adaptive filter structure", Proc. of ICA SSP, pp. 1661-1664, 1998.

R. Merched, et al., "A new delayless subband adaptive filter structure", IEEE Trans. on signal Proc., vol. 47, No. 6, pp. 1580-1591, Jun. 1999.

Sen M. Kuo and Dennis R. Morgan, "Active Noise Control: A Tutorial Review", Proceedings of the IEEE, vol. 87, pp. 943-973, Jun. 1999.

H. Sheikhzadeh, et al., "Performance Limitations of a New Subband Adaptive System for Noise and Echo Reduction", Proc. of IEEE ICECS, pp. 1-4, 2003.

P. L. De Leon III, et al., "Experimental Results With Increased Bandwith Analysis Filters in Oversampled, Subband Acoustic Echo Cancellers", IEEE Sig. Proc. Letters, vol. 2, pp. 1-3, Jan. 1995.

Albu, et al., "The Gauss-Seidel Pseudo Affine Projection Algorithm and its Application for Echo Cancellation," $37^{th}$ Asilomar Conf. Sig. Sys. & Comp., Pacific Grove, Calif., pp. 1303-1306, Nov. 2003.

H. Sheikhzadeh, et al., "Partial update subband implementation of complex pseudo-affine projection algorithm on oversampled filterbanks", ICASSP, 2005 IEEE International Conference on Acoustics, Speech, and Signal Processing, pp. 1-4, Mar. 18-23, 2005.

Bharath Siravara, et al., "Comparative Study of Wideband Single Reference Active noise Cancellation Algorithms on a Fixed-Point DSP", ICASSP, 2003 IEEE International Conference on Acoustics, Speech, and Signal Processing, pp. II-473 to II-476, 2003.

Marian R. Petraglia, et al., "A New Open Loop Delayless Subband Adaptive Filter Structure", IEEE, pp. II-1345 to II-1348, 2002.

Dennis R. Morgan and James C. Thi, "A Delayless Subband Adaptive Filter Architecture", IEEE Transactions on Signal Precessing, vol. 43, No. 8, pp. 1819-1830, Aug. 1995.

John M. Cioffi and John A.C. Bingham, "A Data-Driven Multitone Echo Canceller", IEEE, pp. 0057-0061, 1991.

J.M. de Haan, et al., "Filter Bank Design for Delayless Subband Adaptive Filtering Structures with Subband Weight Transformation", pp. 187-201, at least as early as Jun. 30, 2005.

Lars-Olof Larson, et al., "A New Subband Weight Transform for Delayless Subband Adaptive Filtering Structures", IEEE, pp. 201-206, 2002.

Jiaquan Huo, et al., "New Weight Transform Schemes for Delayless Subband Adaptive Filtering", IEEE, pp. 197-201, 2001.

J. M. de Haan, "Convergence and Complexity Analysis of Delayless Subband Adaptive Filters", pp. 205-280, at least as early as Jun. 30, 2005.

Shuichi Ohno and Hideaki Sakai, "On Delayless Subband Adaptive Filtering by Subband/Fullband Transforms", IEEE Signal Processing Letters, vol. 6, No. 9, pp. 236-239, Sep. 1999.

Kiyoshi Nishikawa and Hitoshi Kiya, "Conditions for Convergence of a Delayless Subband Adaptive Filter and Its Efficient Implementation", IEEE Transactions on Signal Processing, vol. 46, No. 4, pp. 1158-1167, Apr. 1998.

Timo I. Laakso, et al., "Splitting the Unite Delay: Tools for fractional delay filter design", IEEE Signal Processing Magazine, pp. 30-60, Jan. 1996.

Noriyuki Hirayama, et al., "Delayless Subband Adaptive Filtering Using the Hadamard Transform", IEEE Transactions on Signal Processing, vol. 47, No. 6, pp. 1731-1734, Jun. 1999.

Ricardo Merched, et al., "A New Delayless Subband Adaptive Filter Structure", IEEE Transactions on Signal Processing, vol. 47, No. 6, pp. 1580-1591, Jun. 1999.

Yosef Bendel, et al., "Delayless Frequency Domain Acoustic Echo Cancellation", IEEE Transactions on Speech and Audio Processing, vol. 9, No. 5, pp. 589-597, Jul. 2001.

Noriyuki Hirayama and Hideaki Sakai, "Analysis of a Delayless Subband Adaptive Filter", IEEE, pp. 2329-2332, 1997.

Hai Huyen Dam, et al., "Non-Causal Delayless Subband Adaptive Equalizer", IEEE, pp. III-2649 to III-2652, 2002.

Shing Tenqchen, et al., "Design of a Normalized Delayless LMS Adaptive Subband Digital Filter", Proceedings of the 2000 IEEE International Conference on Control Applications, Anchorage, Alaska, USA, pp. 513-518, Sep. 25-27, 2000.

Jeong-Hyeon Yun, et al., "Subband Active Noise Control Algorithm Based on a Delayless Subband Adaptive Filter Architecture", IEEE, pp. 391-394, 1997.

Shigeyuki Miyagi and Hideaki Sakai, "Convergence Analysis of the Delayless Subband Adaptive Filter Based on the Frequency Domain Expression", IEEE, pp. 368-371, 2000.

James P. Reilly, et al., "The Complex Subband Decomposition and its Application to the Decimationof Large Adaptive Filtering Problems", IEEE Transactions on Signal Processing, vol. 50, No. 11, pp. 2730-2743, Nov. 2002.

Jan Mark de Haan, et al., "Filter Bank Design for Delayless Subband Adaptive Filtering Structures With Subband Weight Transformation", IEEE, pp. 251-256, 2002.

Jeong-Hyeon Yun, et al., "An Active Noise Control Algorithm with On-Line system Identification Based on a Delayless Subband Adaptive Filter Architecture", IEEE, pp. 1370-1373, 1997.

Seon Joon Park, et al., "A Delayless Subband Active Noise Control System for Wideband Noise Control", IEEE Transactions on Speech and Audio Processing, vol. 9, No. 8, pp. 892-899, Nov. 2001.

R.E. Crochiere, et al., "Performance Limitations of a New Subband Adaptive System for Noise and Echo Reduction," *Multirate Digital Signal Processing*, Prentice-Hall Signal Processing Series, Prentice-Hall, pp. 325-326, at least as early as Jun. 30, 2005.

\* cited by examiner

FIG. 23: Delayless SAF system using oversampled filterbanks, employing weight transform for time-filter reconstruction.

Fig. 24   Reconstruction of TAF through WOLA synthesis of the SAFs

Oversampled SAF system applied to echo cancellation.

(A) Time-domain echo plant, and the reconstructed plant with SGS-PAP adaptation, for D=1,8,
(B) error in reconstructed TAFs for D=1 and (C) error for D=8.

FIG. 28  ERLE results for SGS-PAP adaptation with D=1,8, for Figure 24 and 26.

METHOD AND SYSTEM FOR ACTIVE NOISE CANCELLATION

FIELD OF INVENTION

The present invention relates to signal processing and modeling technique, and more specifically to signal processing and modeling technique for noise cancellation.

BACKGROUND OF THE INVENTION

Analog active noise cancellation (ANC) systems suffer from a number of problems. Specifically, they are prone to acoustic feedback, and they do not provide as high a degree of cancellation for periodic or other quasi-stationary signals as can be realized with a digital signal processing (DSP) enhanced analog ANC system.

Analog ANC systems are also difficult to adjust (or "tune") for different headset designs and also in a production environment where normal production variations in transducers and listening device assembly increase the likelihood of acoustic feedback.

Further, current analog ANC techniques address only part of the noise cancellation that is needed by users in high noise environments. Specifically, analog ANC provides noise cancellation at predominantly low frequencies (below 1500 Hz to 2000 Hz).

Fully digital ANC systems are possible. However, group delay or latency is induced by analog to digital (A/D) conversion, digital to analog conversion and digital processing associated with DSP systems. Further, due to power consumption, they are not practical in many portable applications.

U.S. Pat. Nos. 5,475,761, 5,699,436, and 5,815,582 by Noise Cancellation Technologies (NCT) disclose methods of digital ANC. using a combination of both feedback and feedforward methods. The methods employ DSP to perform ANC. However, due to the inherent delay in the DSP, they are not practical for most applications when low-power, low-cost, and small-size constraints are applied. There are many other similar DSP-based systems that suffer from the same delay problem, for example, the systems disclosed in U.S. Pat. Nos. 6,418,227 B1, 5,991,418 and 5,940,519 by Kuo et al. from Texas Instruments Inc.

U.S. Pat. Nos. 6,069,959 and 6,118,878 by NCT disclose fully analog solutions to the ANC problems. Specifically, as U.S. Pat. No. 6,118,878 explains, significant tuning and adaptation of the system parameters are necessary to avoid instability and artifacts. However, the patent suggests that the tuning can be implemented using analog components and methods.

DSP-controlled ANC systems have tried to address the difficult problem of tuning of the analog ANC systems through the use of CPUs and signal processing methods. For example, U.S. Pat. No. 5,440,642 by Denenberg et al. discloses DSP techniques that can control ANC system parameters, such as loop gain and loop filter frequency response. U.S. Patent application Publication No. 20040037430 A1 uses DSP techniques (LMS adaptation) to control the secondary path typically used in the filtered-X LMS algorithm. U.S. Pat. No. 4,965,832 uses DSP control of a feed-forward ANC system to control the loop-gain and the loop-filter bandwidth. U.S. Pat. No. 6,278,786 B1 uses DSP to not only control the loop-gain but also to provide an acoustic signal (to be added to the analog ANC anti-noise) that will cope with tonal noises more effectively.

Subband adaptive filters (SAFs) become an interesting and viable option for many adaptive systems. The SAF approach uses a filterbank to split the fullband signal input into a number of frequency bands, each serving as input to an adaptive filter. This subband decomposition greatly reduces the update rate and the length of the adaptive filters resulting in much lower computational complexity.

To be able to employ powerful SAF method for ANC, one has to tackle a processing delay issue.

To reduce the processing delay in the SAFs, U.S. Pat. No. 5,329,587 by Morgan et al. has introduced a method of reconstructing the subband filter back into time-domain. Starting with adapted subband filters, they first transform the SAFs into the frequency-domain (using an FFT), appropriately stack the results, and inverse transform them back into time-domain to obtain a time-domain adaptive filter. The time-domain filter is then used to implement time-domain adaptive filtering. The details of their technique are also reported in a research paper Morgan et. al. ("A delayless subband adaptive filter structure", IEEE Trans. on Signal Proc., Vol. 43, pp. 1819-1830, Aug. 1995.) that offers a good survey of previous efforts on low-delay adaptive systems. Let us call this method DFT-1 Stacking as disclosed in J. Huo et al. ("New weight transform schemes for delayless subband adaptive filtering", in Proc. of IEEE Global Telecom. Conf., pp. 197-201, 2001). After analyzing Morgan's method in by J. Huo et al., they offer two variations to the method (known as "DFT-2 Stacking" and "DFT-FIR Stacking") to improve the performance. These methods are all based on DFT, proper stacking, and inverse DFT. In DFT-FIR, a convolution with a synthesis filter after DFT is also added. Moreover in L. Larson et al. ("A new subband weight transform for delayless subband adaptive filtering structures", in Proc. of IEEE DSP workshop, pp. 201-206), a Linear Weight Transform method is introduced. The method employs a linear matrix transformation of the subband filters using both analysis and synthesis filters to recover the time-domain adaptive filter. In yet another set of works following Morgan's method, a different method is proposed that employs the Hadamard transform to reconstruct the time-domain filter (N. Hirayama and H. Sakai, "Analysis of a delayless subband adaptive filter", in Proc. of ICASSP, pp. 2329-2332, 1997; and N. Hirayama et al., "Delayless subband adaptive filtering using the hadamard transform", IEEE Trans. on Signal Proc., Vol. 47, No. 6, pp. 1731-1734, June 1999).

In a series of research paper presented from 1997 to 1999, Merched et al. present methods of transferring the SAFs to time-domain (R. Merched et al. "A Delayless alias-free subband adaptive filter structure", in Proc. of IEEE Int. Symp. On Circuits and Systems, pp. 2329-2332, Jun. 9-12, 1997; P. S. R. Diniz et al. "Analysis of a delayless subband adaptive filter structure", in Proc. of ICASSP, pp. 1661-1664, 1998; R. Merched et al. "A new delayless subband adaptive filter structure", IEEE Trans. on Signal Proc., Vol. 47, No. 6, pp. 1580-1591, June 1999). Their methods are designed only for maximally decimated (QMF) PR filterbanks, and constraints the filterbank prototype filter to be a Nyquist(K) filter (where K represents number of subbands). As a result, the SAFs become simple fractional delay filters. They also use a polyphase fiterbank to reconstruct the time-domain adaptive filter.

U.S. Pat. No. 6,661,895 B1 by Jin et al. discloses a zero-delay SAF system. They discard the initial segment of each SAF to obtain a "forward filter". The estimated (time-domain) echo signal is generated by filtering the reference signal through the subband forward filters and then applying subband reconstruction. The time-domain echo cancelled signal goes through another separate time-domain LMS filter to compensate for the discarded initial segments of subband adaptive filters. The method however has a fundamental problem: the time-domain LMS filter has to model a potentially non-causal filter. This is not practically possible.

Over-sampled subband adaptive filters (OS-SAF) offer many advantages over time-domain adaptive algorithms. However, OS-SAF systems may introduce a group delay or latency that is too high for some applications. The conversion from analog to digital and back again, use of anti-aliasing and anti-imaging filters, as well as the digital processing introduces this delay. Reducing the delay of OS-SAF systems by increasing the sampling rate is not practical in many applications because of power consumed and specialized hardware required.

Also, in the conventional OS-SAF systems, the primary input signal goes through analysis and synthesis stages of the over-sampled filterbank. Often, perfect reconstruction (PR) is not practical and only a near PR performance is achieved. As a result, the primary signal may be distorted. To minimize distortions, longer analysis windows have to be employed which further increases the delay and add extra computation cost.

Further, in the conventional OS-SAF systems, the effect of analysis filter band edges and under-modeling errors limit the system performance.

SUMMARY OF THE INVENTION

It is an object of the invention to provide a novel method and system that obviates or mitigates at least one of the disadvantages of existing systems.

It is an object of the invention to provide an improved method and system for active noise cancellation.

The invention relates to the improvements that can be made to well-known analog ANC techniques as well as over-sampled subband adaptive filtering using specialized DSP methods and apparatuses.

According to an aspect of the present invention, there is provided a system for active noise cancellation, includes: a first over-sampled analysis filterbank for transferring a reference signal in a time-domain, which is associated with noise, into a plurality of subband reference signals in a frequency-domain; a second over-sampled analysis filterbank for transferring a primary signal in the time-domain, which is associated with an acoustic signal and may be contaminated by noise, into a plurality of subband primary signals in the frequency-domain; a subband processing module for processing the subband reference signals, the subband primary signals or a combination thereof, and implementing one or more than one subband adaptive algorithm in the frequency-domain; and an over-sampled synthesis filterbank for transferring the outputs of the subband processing module into a time-domain output signal.

According to a further aspect of the present invention, there is provided a system for active noise cancellation, includes: an over-sampled analysis filterbank for transferring a primary signal in a time-domain, which is associated with an acoustic signal and may be contaminated by noise, into a plurality of subband primary signals in a frequency-domain; a subband processing module for the subband primary signals and implementing one or more than one subband adaptive algorithm in frequency-domain; and an over-sampled synthesis filterbank for transferring the outputs of the subband processing module into a time-domain output signal.

According to a further aspect of the present invention, there is provided a system for active noise cancellation, includes: a first analysis filter bank for transferring a reference signal in a time-domain into a plurality of subband reference signals in a frequency-domain; a second analysis filter bank for transferring a primary signal in the time-domain, which is associated with an acoustic signal and may be contaminated by noise, into a plurality of subband primary signals in the frequency-domain; a subband estimator for modeling subband acoustic transfer function for the subband reference signals; a subband adaptive filter for providing a plurality of subband output signals in response to the subband reference signals; an adjustor for adjusting the subband adaptive filter in response to the subband primary signals and the modeling for the subband reference signals; and a synthesis filter bank for transferring the subband output signals to a time-domain output signal.

According to a further aspect of the present invention, there is provided a system for active noise cancellation, includes: an analysis filter bank for transferring a primary signal in a time-domain into a plurality of subband primary signals in a frequency-domain; a subband filter bank for providing a plurality of subband output signals in response to a plurality of subband reference signals; a synthesis filter bank for transferring the subband output signals into a time-domain output signal; and a feed-back loop for generating the subband reference signals, including: a first subband estimator for modeling subband acoustic transfer function for the subband output signals; a signal path for providing the subband reference signals in response to the subband primary signals and the modeling for the subband output signals; a second subband estimator for modeling subband acoustic transfer function for the subband reference signals; and an adjustor for adjusting the subband adaptive filter in response to the subband primary signals and the modeling for the subband reference signals.

According to a further aspect of the present invention, there is provided a system for active noise cancellation, includes: a first analysis filter bank for transferring a primary signal in a time-domain into a plurality of subband primary signals in a frequency-domain; a time-domain filter bank for providing a time-domain output signal in response to a reference signal in the time-domain; a feed-back loop for generating the reference signal, including: a first subband estimator for modeling subband acoustic transfer function for the time-domain output signal, a signal path for providing the reference signal in the time-domain in response to a primary signal in the time-domain and the modeling for the time-domain output signal, a second subband estimator for modeling subband acoustic transfer function for the subband reference signal, a second analysis filter bank for transferring the primary signal into a plurality of subband primary signals in the frequency-domain, an adjustor for adjusting the subband adaptive filter in response to the subband primary signals and the modeling for the reference signal, and a synthesis filter bank for converting the subband adaptive filter to the time-domain filter bank for filtering the reference signal.

According to a further aspect of the present invention, there is provided a system for active noise cancellation, includes: an analog active noise cancellation (ANC) system for performing an active noise cancellation to a primary signal in a time-domain, which is associated with an acoustic signal and may be contaminated by noise; a first over-sampled analysis filterbank for transferring a reference signal in the time-domain into a plurality of subband reference signals in a frequency-domain, the reference signal in the time-domain being associated with the noise; a second over-sampled analysis filterbank for transferring the primary signal in the time-domain into a plurality of subband primary signals in the frequency-domain; a subband processing module for processing the subband reference signals, the subband primary signals or a combination thereof, and for adjusting one or more parameters of the analog ANC system; an over-sampled synthesis filterbank for performing conversion on the outputs of the subband processing module from the frequency-domain to the time-domain.

According to a further aspect of the present invention, there is provided a system for active noise cancellation, includes: an analog active noise cancellation (ANC) system for performing an active noise cancellation to a primary signal in a time-domain, which is associated with an acoustic signal and may be contaminated by noise; an over-sampled analysis filterbank for transferring the primary signal in the time-domain into a plurality of subband primary signals in a frequency-domain; a subband processing module for processing the subband primary signals and for adjusting one or more than one parameter of the analog ANC system; an over-sampled synthesis filterbank for transferring the outputs of the subband processing module into an output signal in the time-domain.

According to a further aspect of the present invention, there is provided a system for active noise cancellation, comprising: a first WOLA analysis filterbank for transferring a reference signal in a time-domain, which is associated with noise, into a plurality of subband reference signals in a frequency-domain; a second WOLA analysis filterbank for transferring a primary signal in the time-domain, which is associated with an acoustic signal and may be contaminated by the noise, into a plurality of subband primary signals; a subband adaptive processing module for processing the output of the first WOLA analysis filterbank, the output of the second WOLA analysis filterbank or a combination thereof, and providing a plurality of subband adaptive filters; and a WOLA synthesis filterbank for synthesizing the subband adaptive filters to provide a time-domain filter for filtering the reference signal in the time-domain.

According to a further aspect of the present invention, there is provided a method for active noise cancellation implemented by the systems described above.

This summary of the invention does not necessarily describe all features of the invention.

BRIEF DESCRIPTION OF THE DRAWINGS

These and other features of the invention will become more apparent from the following description in which reference is made to the appended drawings wherein.

DETAILED DESCRIPTION

Figure 1:
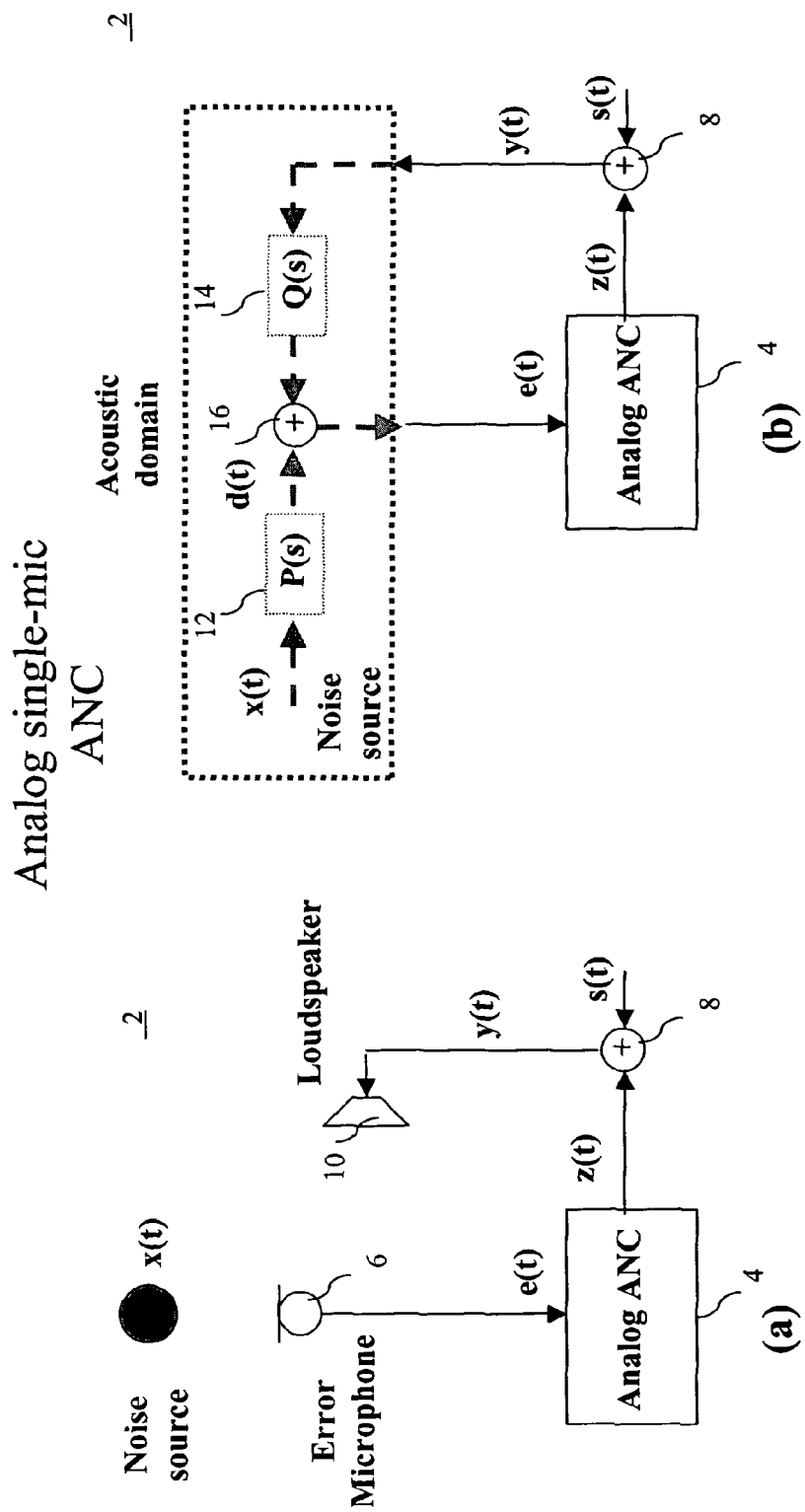
FIG. 1(a) is a diagram showing a conventional analog ANC system.
FIG. 1(b) is a diagram showing a detailed block diagram of FIG. 1(a), depicting a transfer function and an acoustic transfer function.

The embodiments of the present invention are described for a headset. However, the embodiments of the present invention are applicable to any other listening devices, such as portable listening devices. The embodiments of the present invention are described mostly for active noise cancellation and echo cancellation. However, the embodiments of the present invention can be employed for other applications, including adaptive noise cancellation.

The embodiments of the present invention relate to oversampled subband adaptive filtering using specialized DSP techniques and analog ANC techniques. Thus, DSPs are relevant to the technology disclosed below. Because the applications of these techniques are in listening devices and the cancellation relies on acoustic summation, the embodiments of the present invention relates to acoustics.

FIG. 1(a) illustrates a conventional analog ANC system 2 for a headset. As shown in FIG. 1(a), a primary noise signal x(t) is sensed by a microphone 6. The microphone 6 is usually located within the earcup of the headset. For example, the primary noise signal x(t) is a signal outside the earcup of the headset. An analog ANC circuitry 4 receives the microphone signal e(t), and generates an electric signal z(t). The electric signal z(t) is added at 8 with a local audio signal s(t) (possibly speech) to generate an electric speaker signal y(t). The electric speaker signal y(t) is played through a loudspeaker 10 for the listener. The loudspeaker 10 is located within the earcup of the headset. The ANC system 2 tries to cancel the effect of a noise signal for the listener through estimating, generating the signal z(t) to be played through the loudspeaker 10 together with the local audio signal s(t).

FIG. 1(b) illustrates modeling of a transfer function and an acoustic transfer function of FIG. 1(a). P(s) 12 models the transfer function for the acoustic noise signal x(t) to be converted to an electric signal d(t). Q(s) 14 models the acoustic transfer function for the loudspeaker signal y(t) to reach the microphone (6). Usually Q(s) 14 is assumed to be more known than P(s) 12 since the locations of the loudspeaker (10) and the microphone (6) are fixed and known. A through review of the conventional analog ANC system 2 is provided in Kuo-Morgan99 (Sen M. Kuo and Dennis R. Morgan, "Active Noise Control: A Tutorial Review", Proceedings of the IEEE, Vol. 87, June 1999, pp. 943-973).

ANC systems may also provide one or more microphones to measure the ambient noise (e.g. signal x(t) outside of the earcup), however, single microphone systems are generally preferred as discussed later.

Figure 2:
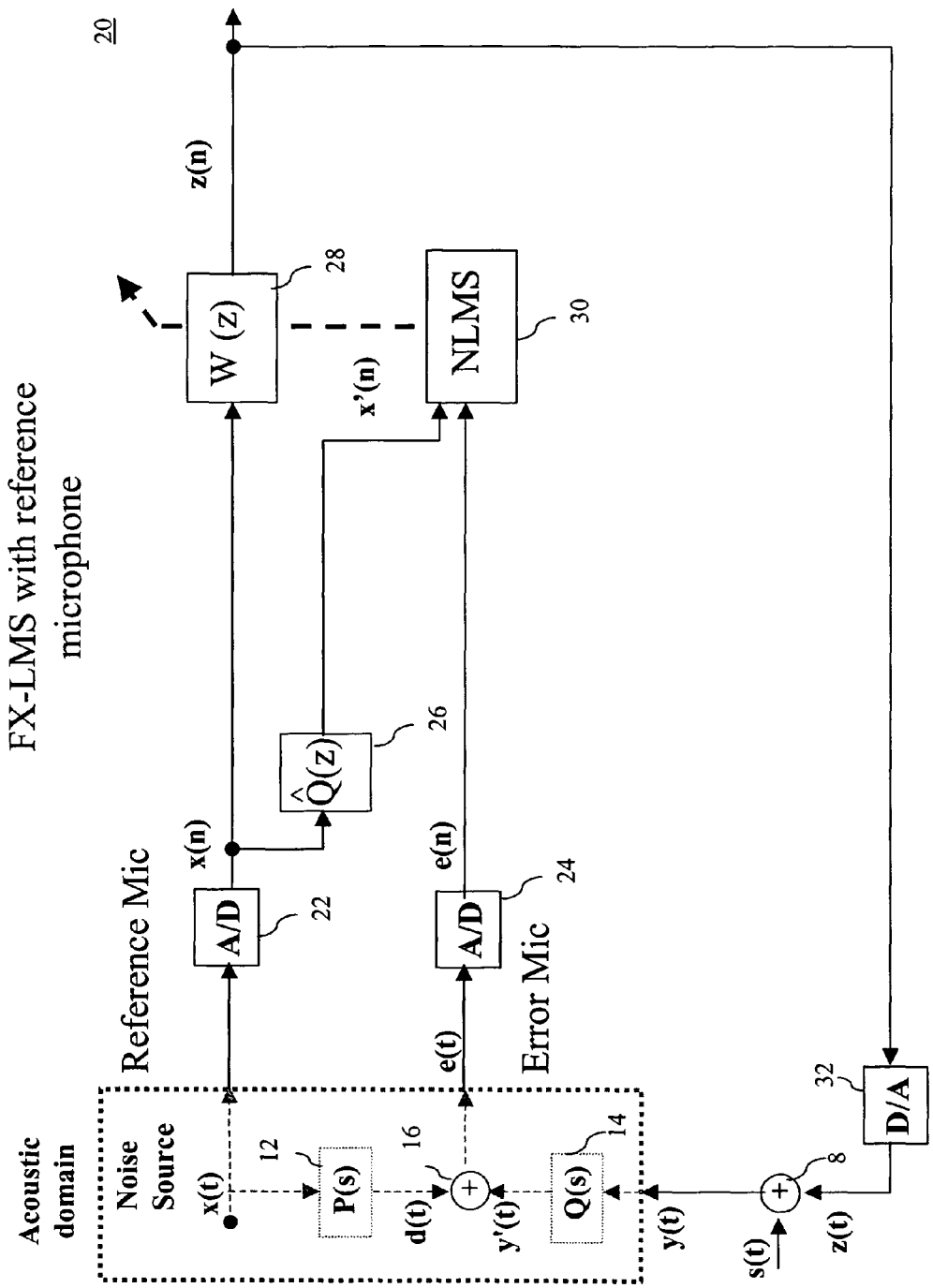
FIG. 2 is a diagram showing a conventional DSP-based ANC system.

FIG. 2 illustrates a conventional DSP-based ANC system 20. The system 20 of FIG. 2 is a feed-forward ANC system, and employs the FX LMS algorithm for active noise cancellation with two microphones. The two microphone signals x(t), e(t) are converted to digital signals x(n), e(n) by analog/digital (A/D) converters 22 and 24, and processed in discrete-time by an algorithm to generate an anti-noise signal z(n). The anti-noise signal z(n) is converted back to an analog signal z(t) by a digital/analog (D/A) converter 32, and played through the loudspeaker together with the signal s(t). The method might employ adaptive methods, such as the Normalized Least Mean Square (NLMS) 30 or similar techniques to adapt an adaptive filter W(z) 28. A rough estimate of the loudspeaker to the error microphone transfer function Q(s) is also required. In FIG. 2, this is depicted by the discrete-time estimated transfer function $\hat{Q}(z)$ 26. Various methods for off-line on-line estimation of Q(s) have been proposed in the prior art and reviewed in Kuo-Morgan99.

Figure 3:
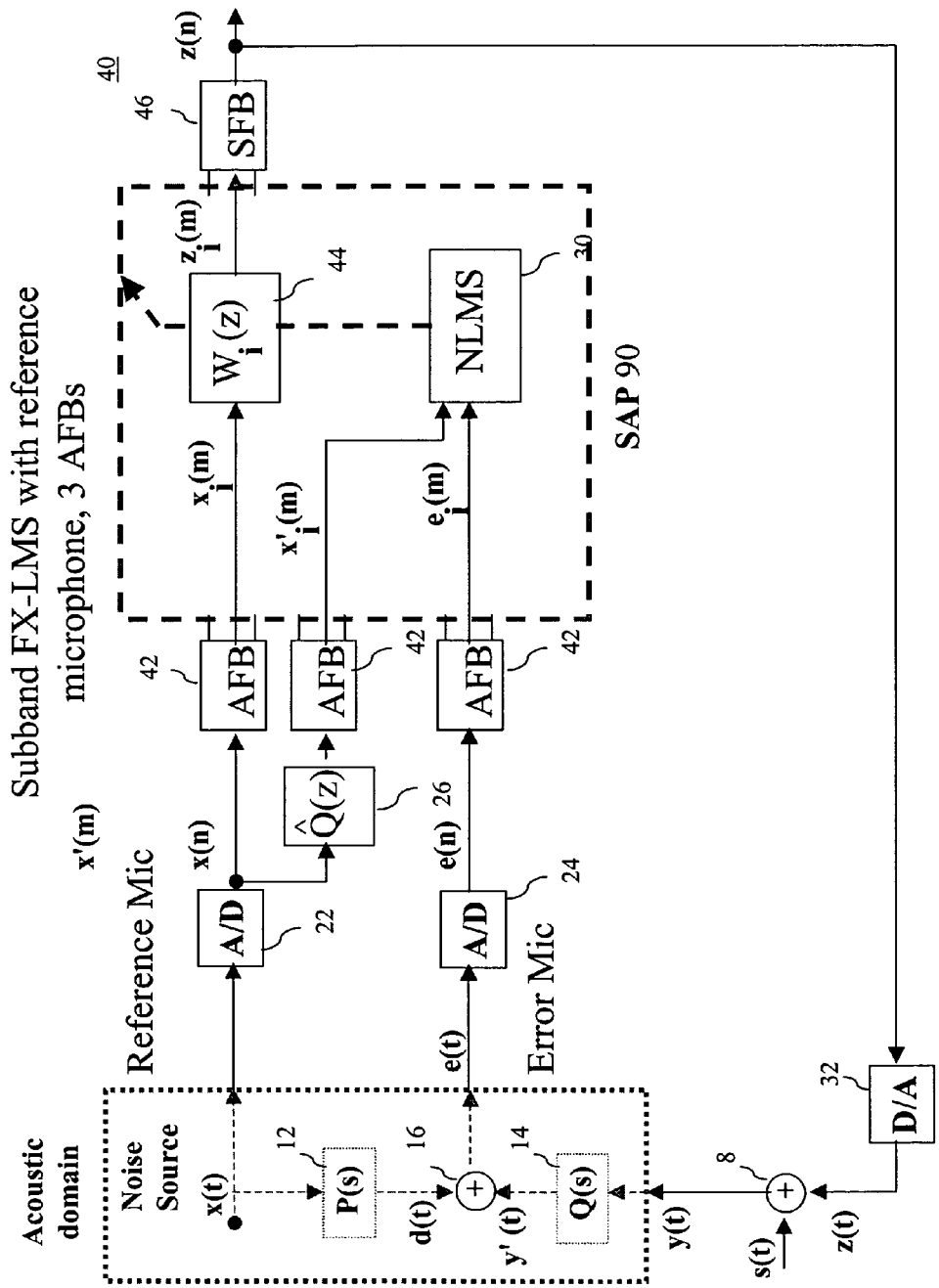
FIG. 3 is a diagram showing a subband ANC system using a subband FX-LMS.

Subband ANC methods have been presented in Kuo-Morgan99 to achieve lower computation cost and faster convergence. FIG. 3 illustrates a conventional subband ANC system for two microphones, employing a subband FX-LMS.

The system 40 of FIG. 3 includes three Analysis Filter Bank (AFB) components 42. The AFB components 42 decompose the time-domain signals e(n), x(n), x'(n) into K (possibly complex) subband signals $e_i(m)$ $x_i(m)$, $x_i'(m)$, i=0, 1, ..., K−1 that might be also decimated in time. There exist K (possibly complex) subband adaptive filers (SAFs) Wi(z) 44 ($W_i(z)$, i=0,1, ..., K−1) which generate subband output signals $z_i(m)$, i=0,1, ..., K−1. All of the adaptive processing is done in a subband adaptive processing (SAP) block 90 in FIG. 3. A Synthesis Filter Bank (SFB) 46 then combines the subband output signals to obtain the time domain signal z(n). The D/A converter 32 converts the time domain, digital signal z(n) into a time domain, analog signal z(t).

Figure 4:
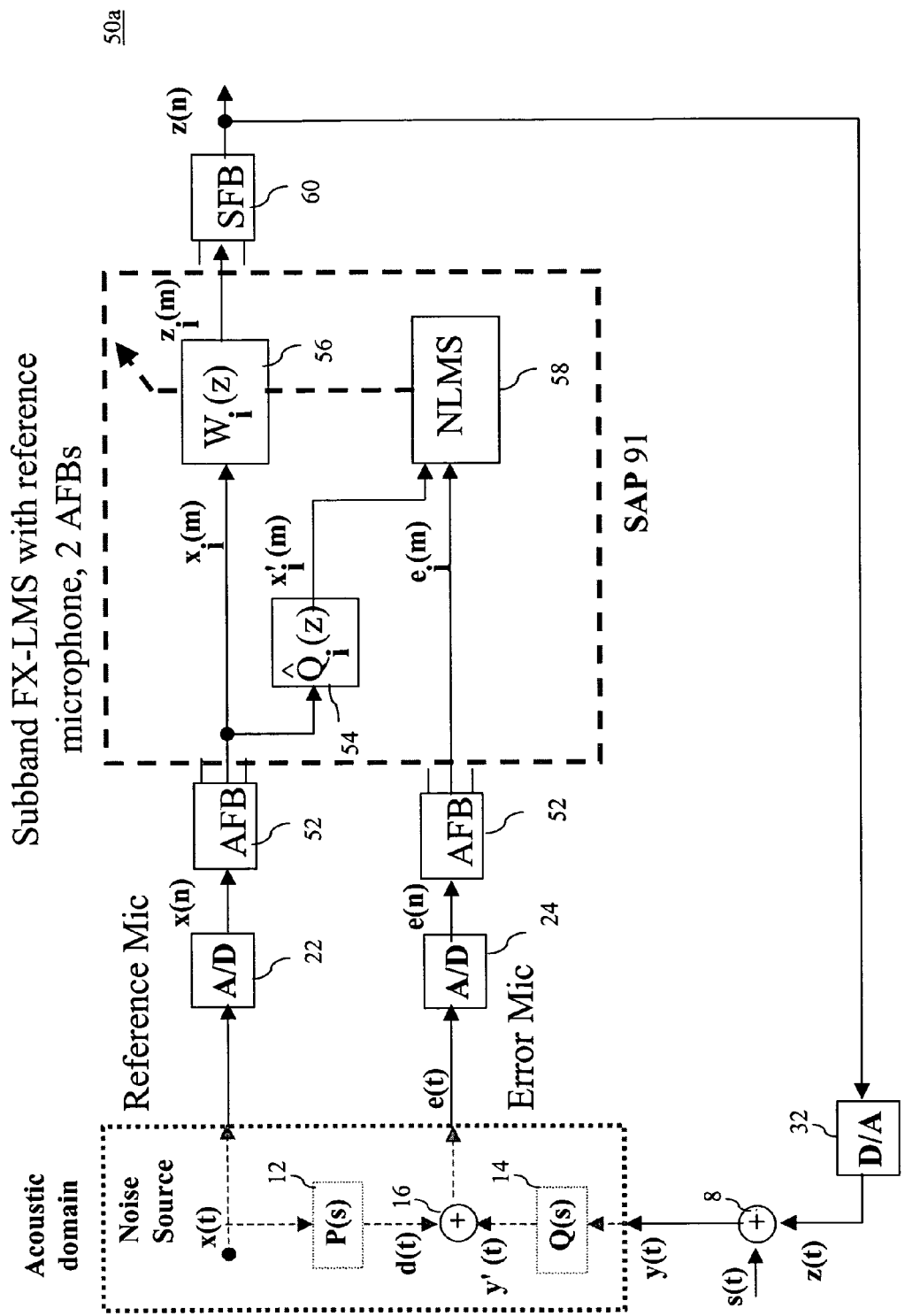
FIG. 4 is a diagram showing a subband ANC system using a subband FX-LMS in accordance with an embodiment of the present invention.

FIG. 4 illustrates a subband ANC system 50a for two microphones in accordance with an embodiment of the present invention. In FIG. 4, adaptive processing is implemented in a SAP block 91. The system 50a of FIG. 4 employs suband FX-LMS, and includes a block 54 that includes a subband estimate of Q(s) depicted as $\hat{Q}_i(z)$, i=0,1, ..., K−1. Subband estimation and implementation of Q(s) allows for faster computation due to parallel subband processing by filters $\hat{Q}_i(z)$. This allows the system 50a to include only two AFBs 52 for two microphones. One AFB is provided to x(n), while the other is provided to e(n). K (possibly complex) subband adaptive filers (SAFs) $W_i(z)$ 56 ($W_i(z)$, i=0,1, ..., K−1) generate subband output signals $z_i(m)$, i=0,1, ..., K−1, based on $x_i(m)$, i=0,1, ..., K−1. A block (such as NLMS) 58 is provided to adapt the subband adaptive filters Wi(z). A SFB 60 combines the subband output signals $z_i(m)$, i=0,1, ..., K−1, to obtain the time domain signal z(n). The D/A converter 32 converts the time domain, digital signal z(n) into a time domain, analog signal z(t).

Figure 5:
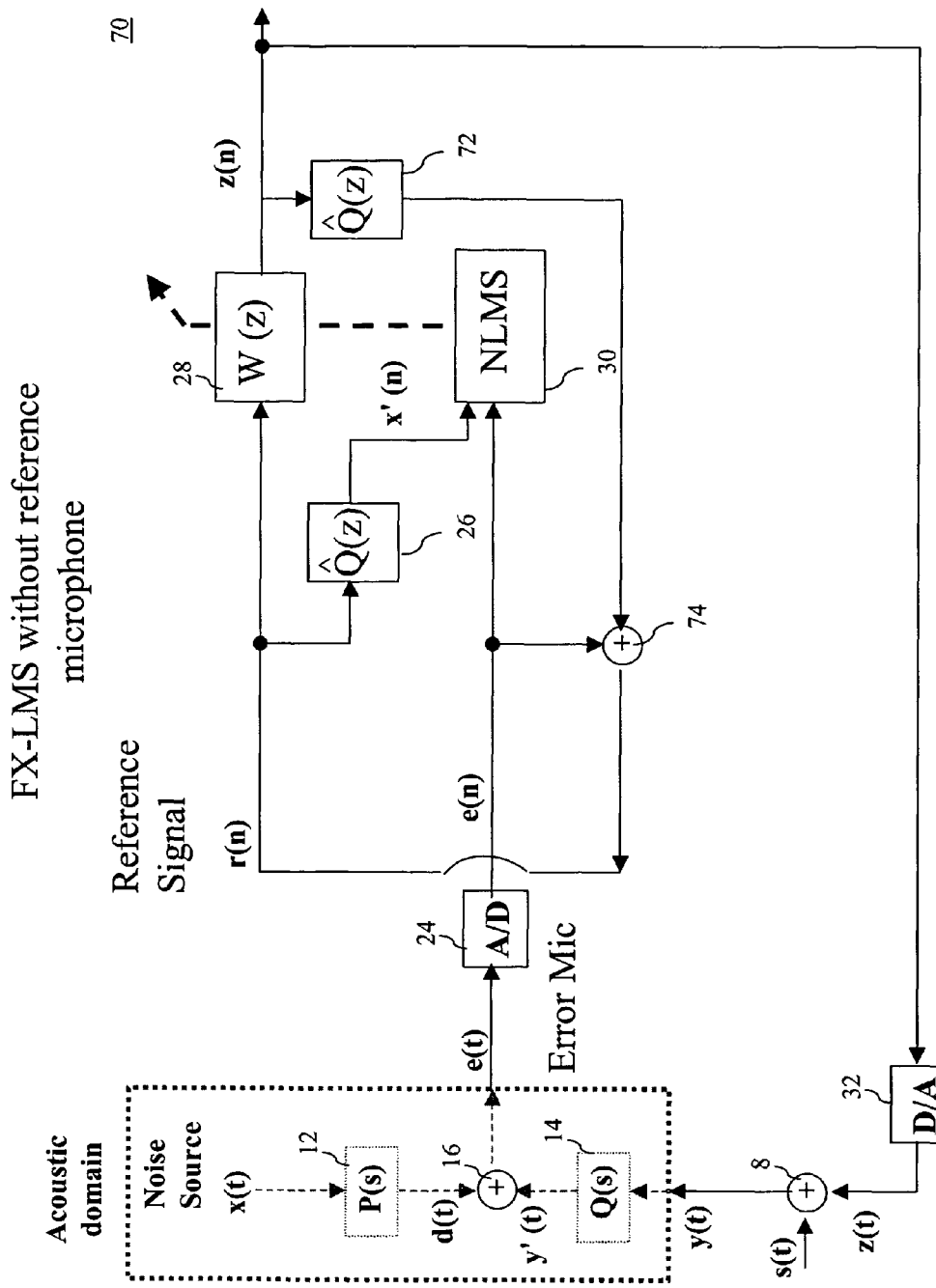
FIG. 5 is a diagram showing a conventional feedback ANC system using a subband FX-LMS.

It is possible to implement FX-LMS with only one microphone as illustrated in FIG. 5. FIG. 5 shows a conventional feedback ANC system 70. The system 70 is disclosed in Kuo-Morgan99. In FIG. 5, the reference signal is reconstructed in the system (signal r(n) ) via a discrete-time estimated transfer function $\hat{Q}(z)$ 72 and a summation node 74.

Figure 9:
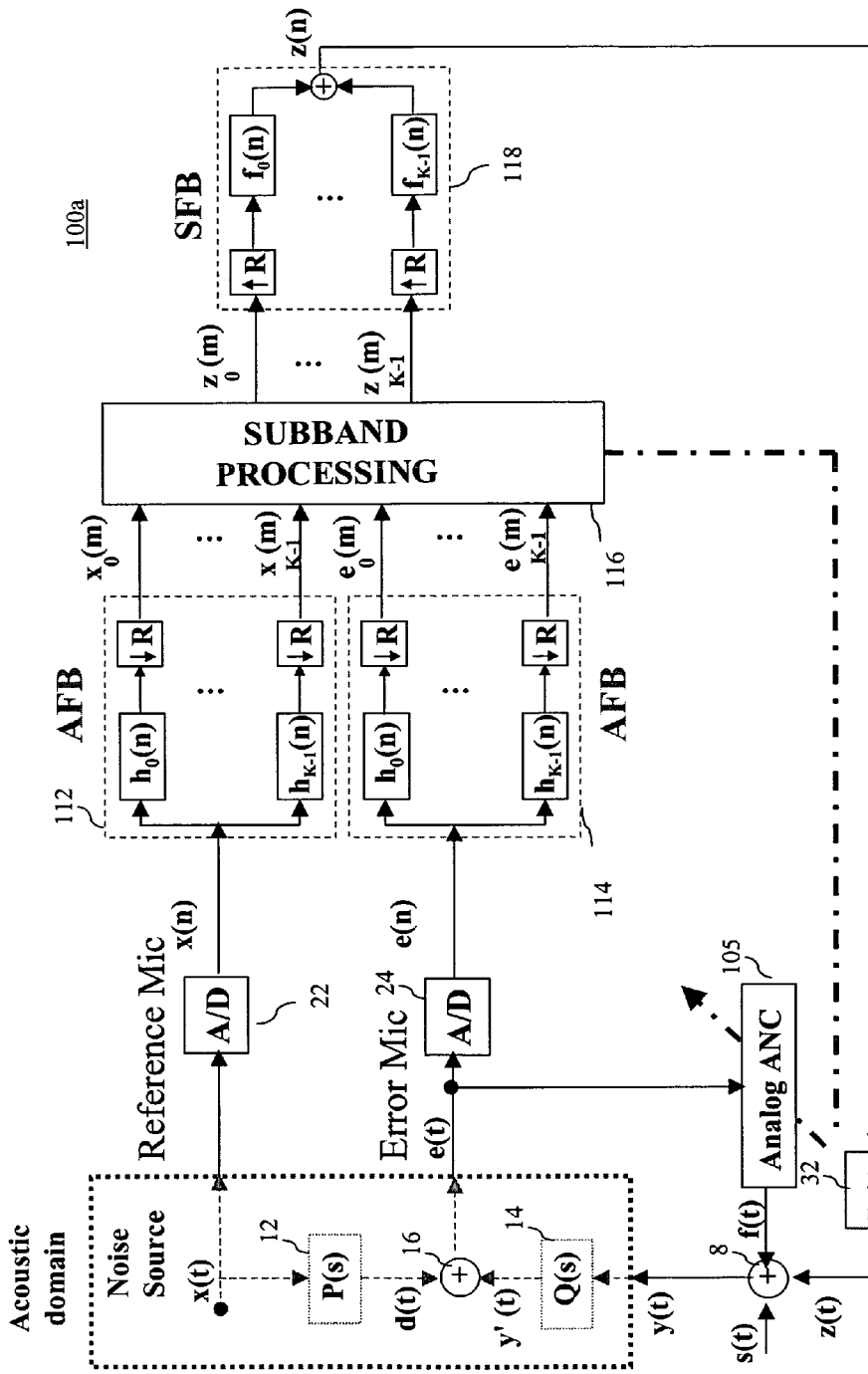
FIG. 9 is a diagram showing an ANC system using over-sampled subband processing in accordance with a further embodiment of the present invention.
Figure 11:
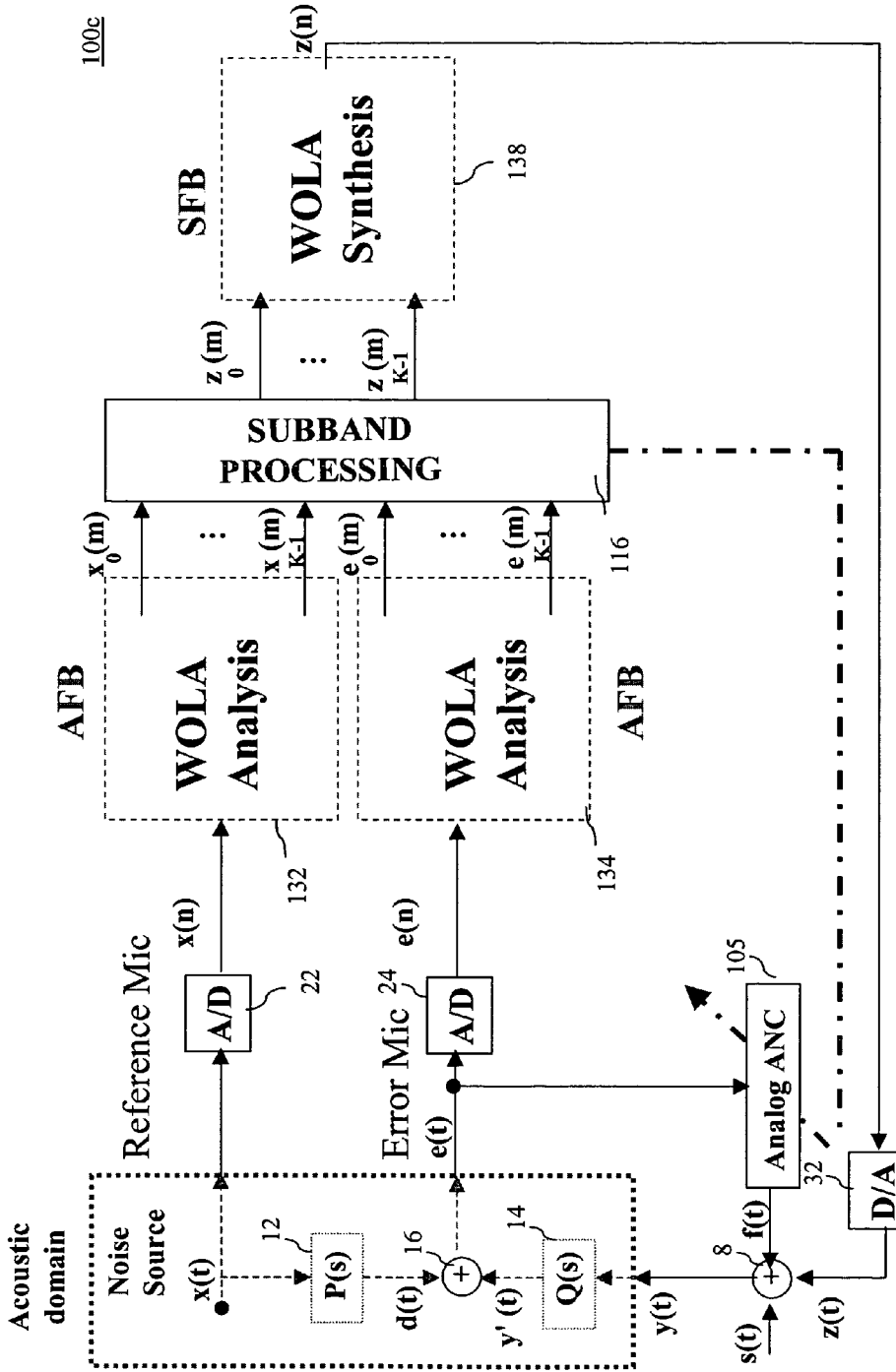
FIG. 11 is a diagram showing an ANC system using Weighted Overlap-Add (WOLA) in accordance with a further embodiment of the present invention.
Figure 16:
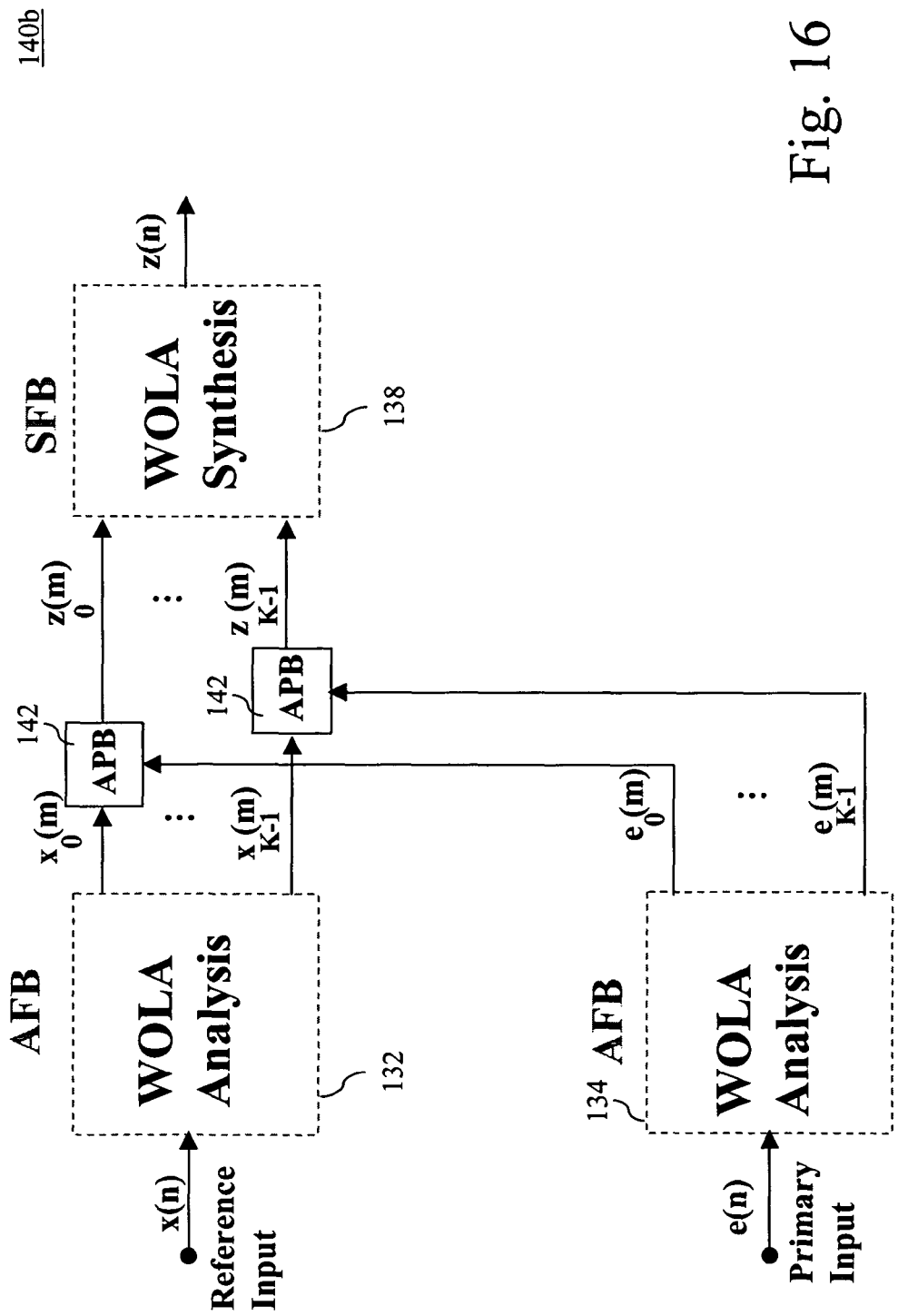
FIG. 16 is a diagram showing an OS-SAF having WOLA.

The system 50a of FIG. 4 may be implemented using oversampled filterbank as shown in FIG. 9. AFBs 52 of FIG. 4 may be implemented by over-sampled analysis filterbanks 112, 114 of FIG. 9. WOLA implementation offers a low-delay, flexible, and efficient implementation of the over-sampled filterbanks as described in U.S. Pat. Nos. 6,236,731, 6,240,192 and 6,115,478, which are incorporated herein by reference. The system 50a of FIG. 4 may be implemented using WOLA filterbank as shown in FIGS. 11 and 16. AFBs 52 of FIG. 4 may be implemented by WOLA analysis filterbanks 132, 134 of FIGS. 11 and 16, and SFB 60 of FIG. 4 may be implemented by a WOLA synthesis filterbank 138 of FIGS. 11 and 16.

Figure 6:
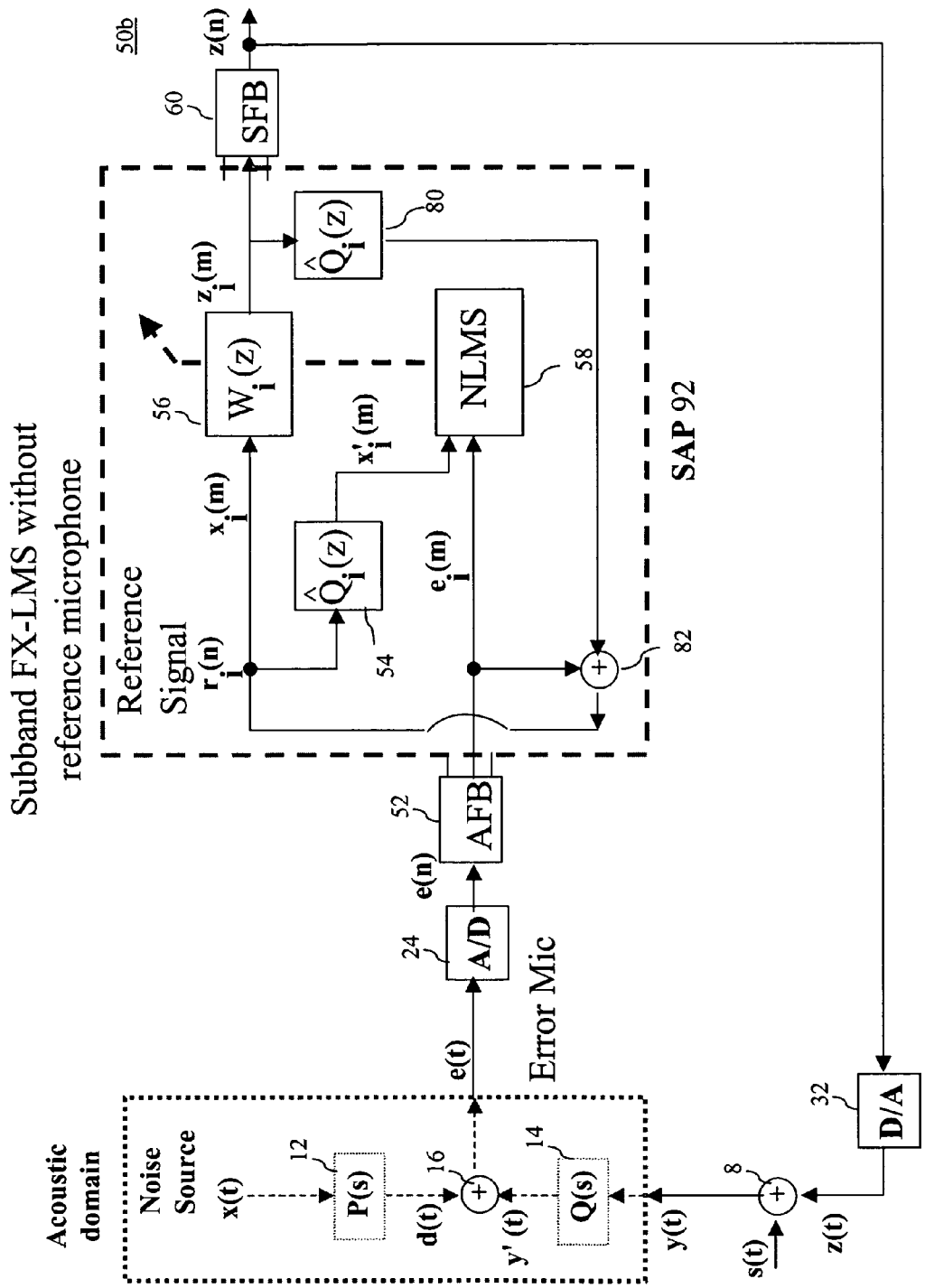
FIG. 6 is a diagram showing a subband feedback ANC system using a subband FX-LMS in accordance with a further embodiment of the present invention.

FIG. 6 illustrates a subband feedback ANC system 50b in accordance with a further embodiment of the present invention. A subband implementation of feedback FX-LMS system is shown in FIG. 6. In FIG. 6, adaptive processing is implemented in a SAP block 92. The reference signal is reconstructed in the system 50b via $\hat{Q}_i(z)$, i=0,1, ..., K−1

(referenced by 80) and a summation node 82. The block 80 includes a subband estimate of Q(s) depicted as $\hat{Q}_i(z)$, i=0,1, . . . , K−1.

As discussed in the prior art (Kuo-Morgan99), the use of AFBs in subband implementations may impose delays on the signal that are often prohibitively large for the operation of the system.

Figure 10:
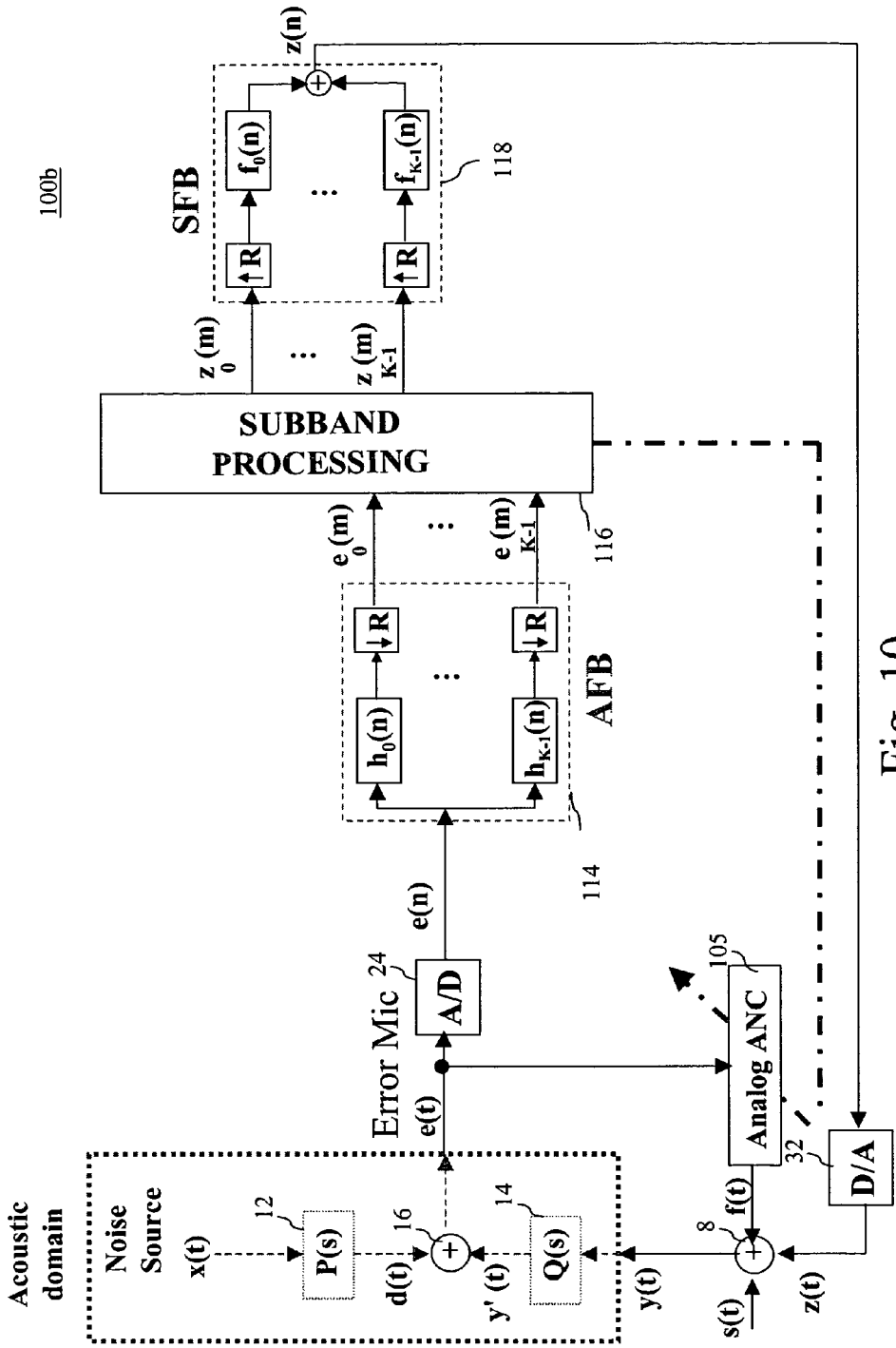
FIG. 10 is a diagram showing a feedback ANC system using over-sampled subband processing in accordance with a further embodiment of the present invention.
Figure 12:
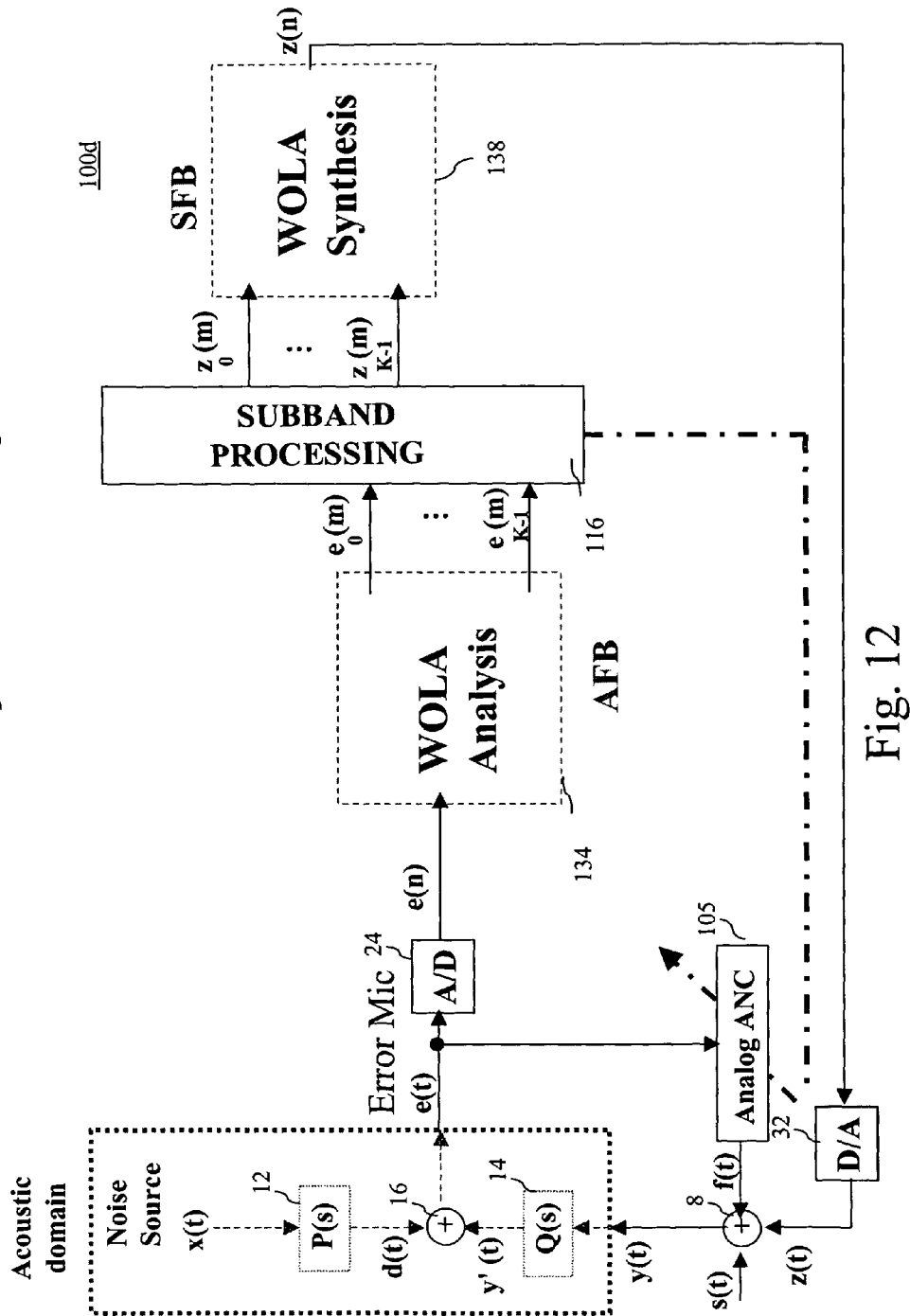
FIG. 12 is a diagram showing a feedback ANC system using WOLA in accordance with a further embodiment of the present invention.

The system 50*b* of FIG. 6 may be implemented using oversampled filterbank as shown in FIG. 10. AFB 52 of FIG. 6 may be implemented by an over-sampled analysis filterbank 114 of FIG. 10. The system 50*b* of FIG. 6 may be implemented using WOLA filterbank as shown in FIG. 12. AFB 52 of FIG. 6 may be implemented by a WOLA analysis filterbank 134 of FIG. 12, and SFB 60 of FIG. 6 may be implemented by a WOLA synthesis filterbank 138 of FIG. 12.

Figure 7:
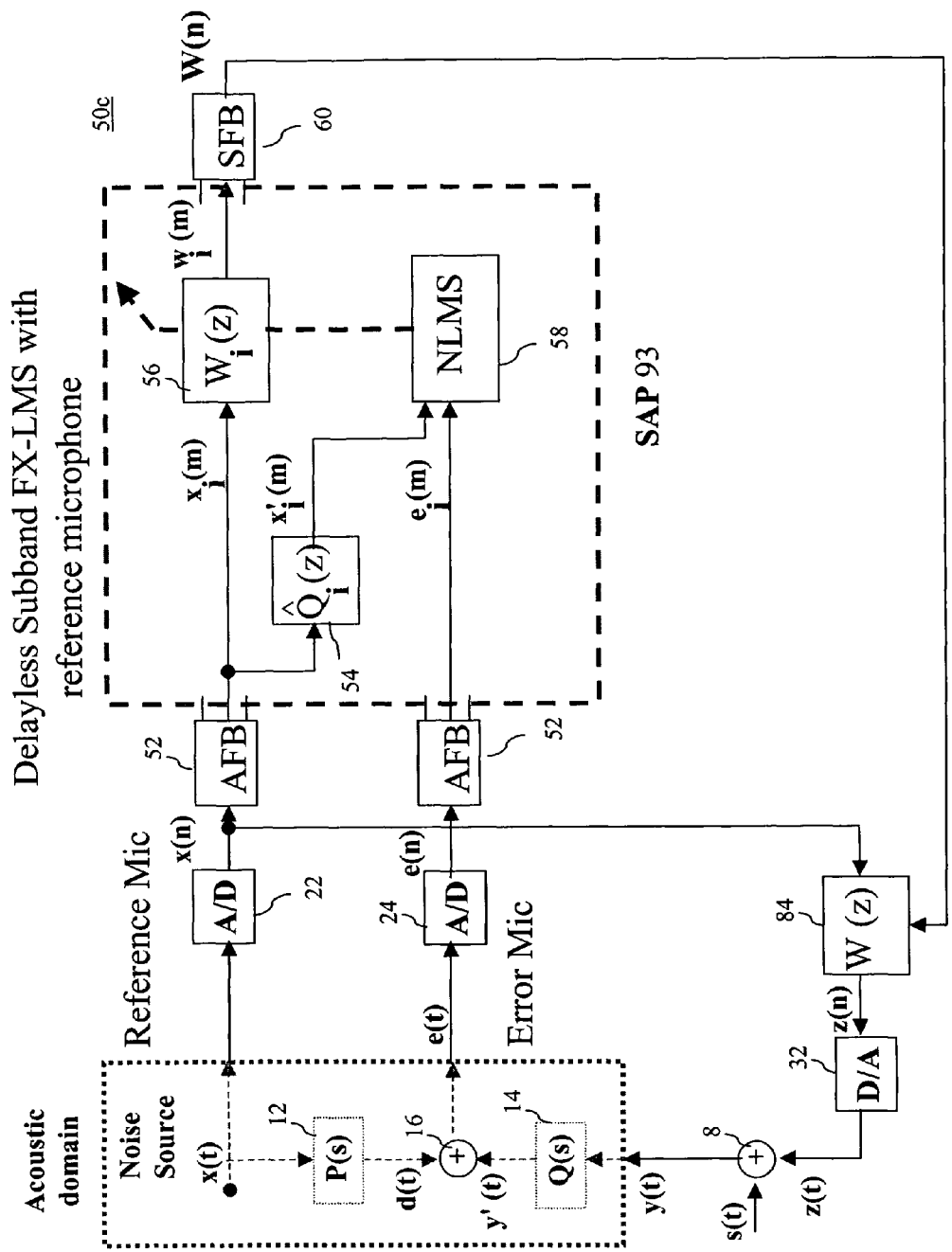
FIG. 7 is a diagram showing a delayless subband ANC system using a FX-LMS in accordance with a further embodiment of the present invention.
Figure 8:
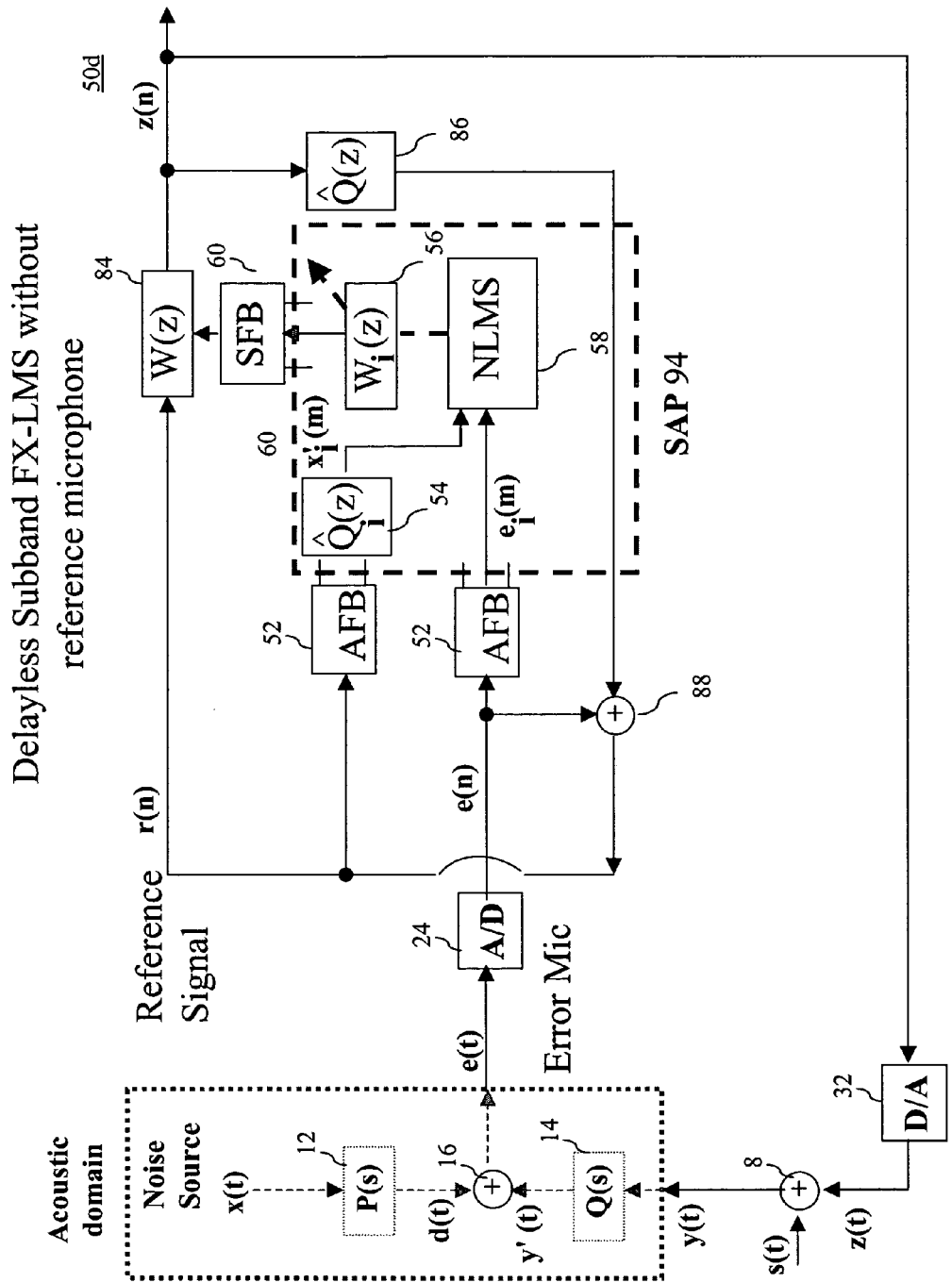
FIG. 8 is a diagram showing a delayless subband feedback ANC system using a FX-LMS in accordance with a further embodiment of the present invention.

Delayless subband ANC systems associated with the systems of FIGS. 4 and 6 are shown in FIGS. 7 and 8. FIG. 7 illustrates a delayless feed-forward subband ANC system 50*c* in accordance with a further embodiment of the present invention. FIG. 8 illustrates a delayless subband feedback ANC system 50*d* in accordance with a further embodiment of the present invention. In FIG. 7, adaptive processing is implemented in a SAP block 93. In FIG. 8, adaptive processing is implemented in a SAP block 94. Each of the systems 50*c* and 50*d* includes the components of the system 50*a* of FIG. 4, and further includes a single time-domain filter W(z) 84. The time-domain filter W(z) 84 is an FIR adaptive filter synthesized from subband adaptive filters 56 by SFB 60 and applied for adaptive filtering in time-domain.

In each of FIGS. 7 and 8, SFB 60 is provided to convert the SAFs $W_i(z)$, i=0,1, . . . , K−1 into the single time-domain filter W(z) 84. Thus, delays due to AFBs are not seen in the signal path. The method to obtain the time-filter from the SAFs is disclosed below in a further embodiment(s) associated with delayless SAF. Using this method, the processing delay of the filterbank is eliminated from the adaptive processing. As a result, more non-stationary components of the noise can also be cancelled through the digital ANC part of the system.

Figure 13:
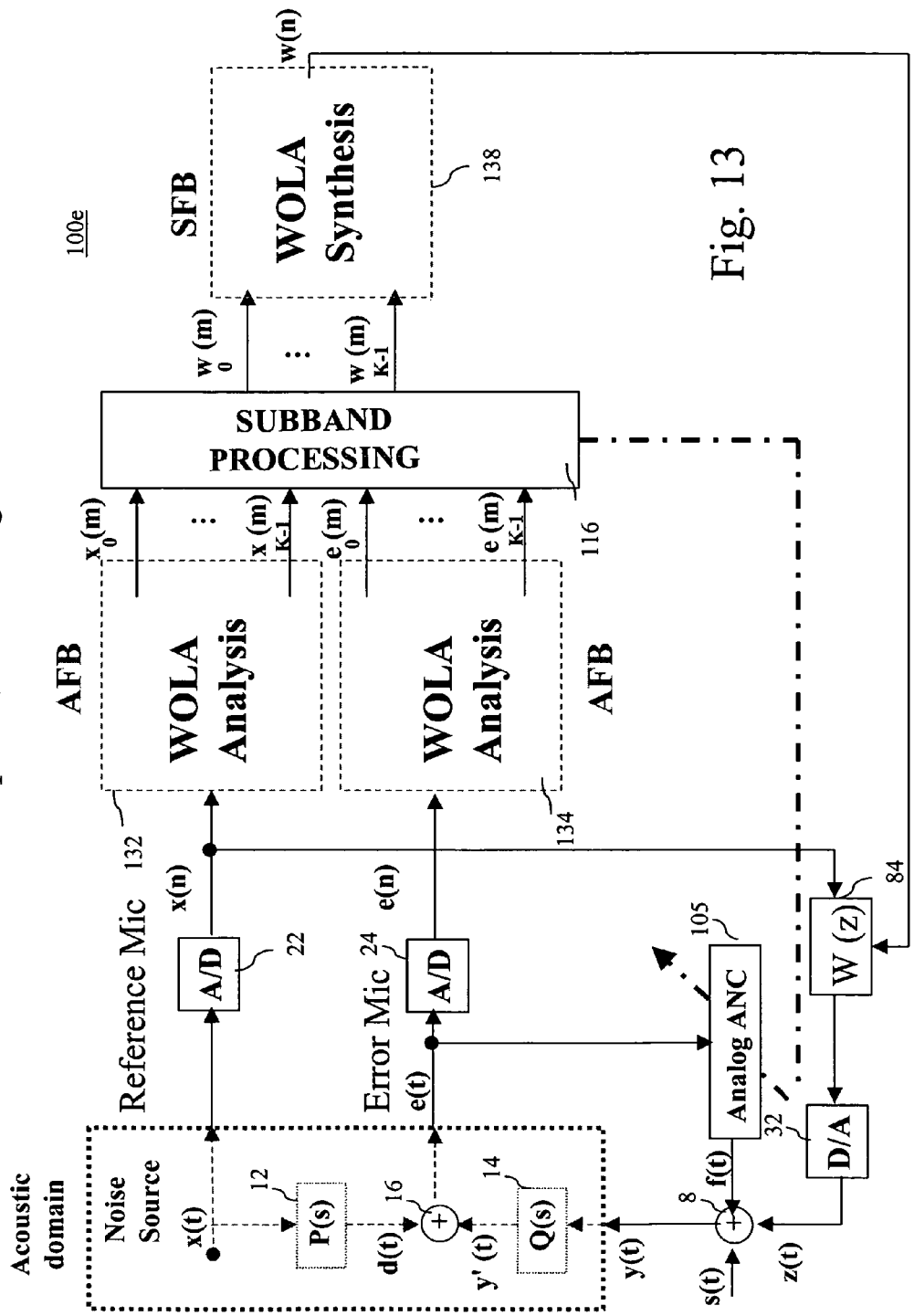
FIG. 13 is a diagram showing an ANC system using WOLA in accordance with a further embodiment of the present invention.
Figure 17:
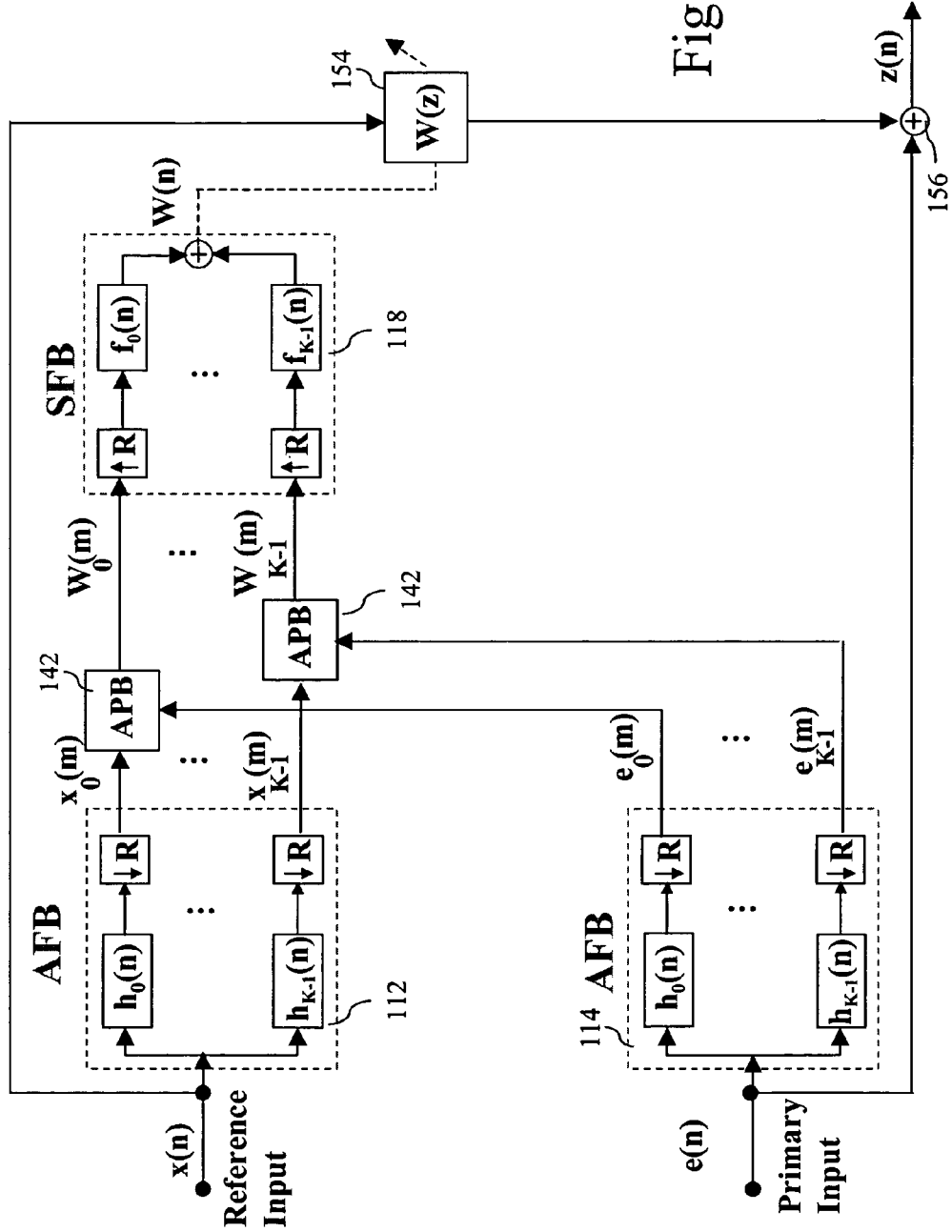
FIG. 17 is a diagram showing an OS-SAF system using over-sampled subband processing in accordance with a further embodiment of the present invention.
Figure 19:
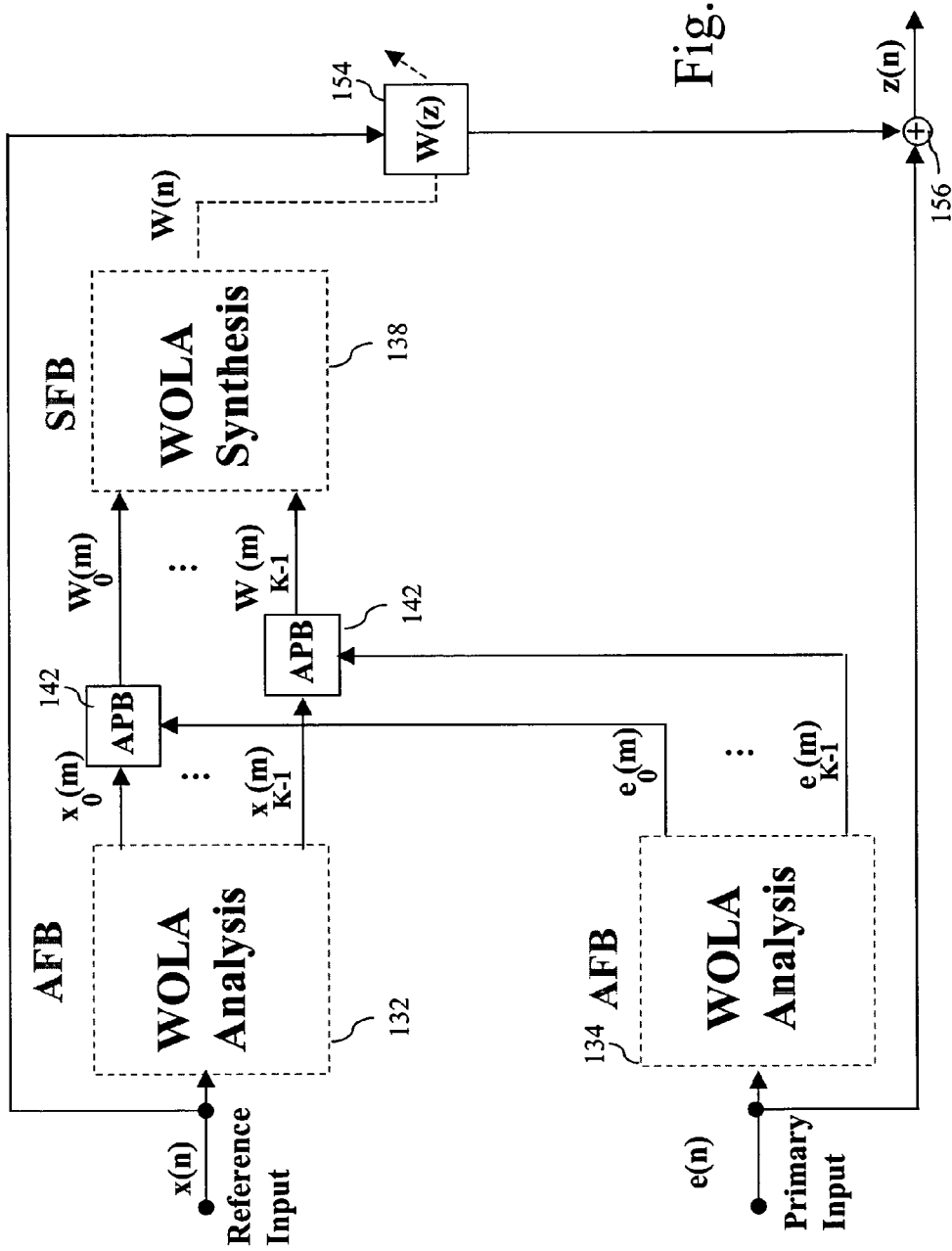
FIG. 19 is a diagram showing an OS-SAF system using WOLA in accordance with a further embodiment of the present invention.

The system 50*c* of FIG. 7 may be implemented using oversampled filterbank as shown in FIG. 17. AFBs 52 of FIG. 7 may be implemented by over-sampled analysis filterbanks 112, 114 of FIG. 17. The system 50*c* of FIG. 7 may be implemented using WOLA filterbank as shown in FIGS. 13 and 19. AFB 52 of FIG. 7 may be implemented by WOLA analysis filterbanks 132,134 of FIGS. 13 and 19, and SFB 60 of FIG. 7 may be implemented by a WOLA synthesis filterbank 138 of FIGS. 13 and 19.

Figure 22:
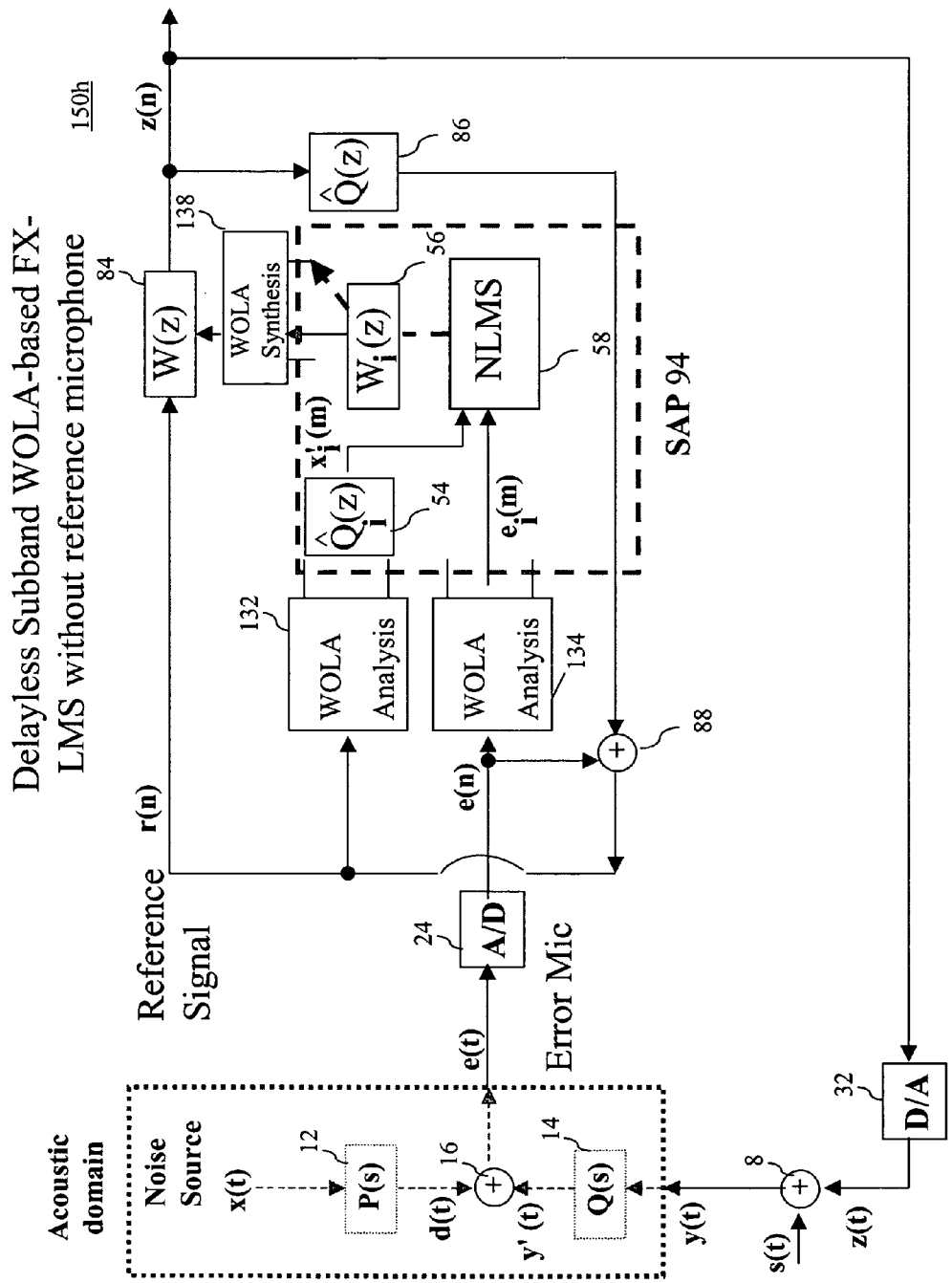
FIG. 22 is a diagram showing a delayless subband feedback ANC system using WOLA in accordance with a further embodiment of the present invention.

The system 50*c* of FIG. 8 may be implemented using oversampled filterbank. The system 50*c* of FIG. 8 may be implemented using WOLA filterbank as shown in FIG. 22. AFBs 52 of FIG. 8 may be implemented by WOLA analysis filterbanks 132,134 of FIG. 22, and SFB 60 of FIG. 8 may be implemented by a WOLA synthesis filterbank 138 of FIG. 22.

U.S. Patent application Publication No. 20030198357 (Ser. No. 10/214,056), entitled "Sound Intelligibility Enhancement Using a Psychoacoustics Model and an Over-sampled Filterbank", which is incorporated herein by reference, discloses the use of ANC in combination with other techniques to improve the intelligibility of audio signals. The sound intelligibility enhancement disclosed in this U.S. application is applicable to the ANC systems of FIGS. 3, 4 and 6-8.

Convergence improvement techniques such as whitening by decimation (WBD), whitening by spectral emphasis (WBS), and whitening by decimation and spectral emphasis (WBDS), disclosed in U.S. Patent application Publication Nos. 20030108214 and 20040071284 (Ser. Nos. 10/214,057 and 10/642,847), which are incorporated herein by reference, can be employed in combination with all methods and systems described in FIGS. 3, 4, and 6-8.

A combination of an analog ANC and subband processing is now described in detail. In FIGS. 9-13, the analog ANC and the subband processing are combined to achieve a higher performance as described below.

FIG. 9 illustrates an ANC system 100*a* in accordance with a further embodiment of the present invention. The system 100*a* of FIG. 9 includes an analog ANC 105 and subband processing. The analog ANC 105 may be the analog ANC 2 of FIG. 1.

Comparing FIG. 9 with FIG. 1(*b*), it can be seen that the analog ANC system is entirely embedded in the system 100*a*. The system 100*a* further includes a second (Reference) microphone that is possibly located outside of the headset earcup to sample the noise. The two microphone signals (x(t), e(t) ) are converted to digital, discrete-time signals by the A/D converters 22 and 24 to obtain the signals x(n) and y(n). The signals are next processed by two (identical) over-sampled analysis filterbanks 112 and 114. The subband processing block 116 processes the over-sampled subband signals ($x_i(m)$ and $y_i(m)$, i=0,1, . . . , K−1) output from the over-sampled analysis filterbanks 112 and 114, and detects various system and signal conditions including the brink of instability of the analog ANC 105. Accordingly, it can tune and adjust parameters of the analog ANC system 105 (such as loop-gain, and loop-filter bandwidth) and/or turn on or off certain features (such as feedback loop) of the system 100*a*. The outputs of the subband processing block 116 are synthesized by an over-sampled synthesis filterbank 118, which produces the time domain, digital signal z(n).

The embodiments of the present invention may also employ over-sampled subband processing to provide improved cancellation of periodic or other quasi-stationary signals. Here, the ambient noise (measured by a reference where a microphone is possibly outside the earcup for a feedforward system) is analyzed using subband techniques to determine if there are any stationary (ideally periodic) or quasi-stationary components in the ambient noise. If these components are detected, the DSP will generate a delayed version of this stationary or quasi-stationary signal (shown as z(n) in digital form and z(t) in analog) in FIG. 9 and supply it to the analog ANC subsystem (105) for subtraction.

Adaptive techniques, such as subband adaptive filters on over-sampled filterbanks (OS-SAFs) similar to those disclosed in U.S. Patent application Publication Nos. 20040071284 and 20030108214 can be employed. The FX-LMS algorithm may be employed in subband methods described in FIGS. 3, 4, and 6-8, where OS-SAFs and SAPs are employed. This method of combining the analog and digital ANC provides improved noise cancellation compared to a system that does not employ this technique.

It is noted that in FIG. 9, the reference microphone could have dual usages: 1) to provide information to the subband processing block about the ambient noise in order to control the parameters of the analog ANC system, 2) to provide a reference signal for digital ANC part of the system (employing algorithms such as the FX-LMS). In the system 100*a* of FIG. 9, various versions of the subband FX-LMS, such as feed-forward, feedback, and a combination of the two, may be used for the digital ANC part of the system.

In some systems, only one microphone is available (such as feedback ANC). The system 100*a* of FIG. 9 can be modified to obtain another embodiment disclosed in FIG. 10. FIG. 10 illustrates a feedback ANC system 100*b* in accordance with a further embodiment of the present invention. In the system 100*b*, the subband signals for controlling the analog ANC system 105 are provided only by the error microphone. The SAP block 92 of FIG. 6 can be employed as a part of the subband processing block 116 of FIG. 10 to do adaptive processing. Similarly, the SAP block 91 of FIG. 4 can be employed in the subband processing block 116 of FIG. 9.

The over-sampled filterbanks may be efficiently implemented using WOLA analysis and synthesis. FIG. 11 illustrates an ANC system 100c in accordance with a further embodiment of the present invention. The system 100c of FIG. 11 includes WOLA analysis filterbanks 132 and 134 and a WOLA synthesis filterbank 138. Efficient hardware realizations of the WOLA have been disclosed in U.S. Pat. Nos. 6,236,731 and 6,240,192.

The embodiments of FIGS. 7 and 10 may be efficiently implemented using the WOLA filterbanks as shown in FIGS. 12 and 13, respectively. FIG. 12 illustrates a feedback ANC system 100d in accordance with a further embodiment of the present invention. FIG. 13 illustrates an ANC system 100e in accordance with a further embodiment of the present invention. The subband processing block 116 of FIG. 12 may employ feed-forward FX-LMS strategies, such as the SAP block 94 of FIG. 8. The subband processing block 116 of FIG. 13 may employ feed-forward FX-LMS strategies such the SAP block 93 of FIG. 7.

The subband processing block 116 of FIGS. 9-13 may model one or more than one acoustic transfer function, a transfer function for a microphone, a transfer function for a loudspeaker, or combinations thereof in accordance with an application.

Monitoring the amplitude to the noise to be cancelled may save the battery life. The over-sampled filterbank can also perform this monitoring more accurately using subband processing, since more accurate decision making is possible by monitoring energies of the signals in various subbands. For example, different energy thresholds may be employed for different subbands according to the effectiveness of ANC in various frequency bands.

Delayless SAF through over-sampled synthesis/WOLA synthesis is now described in detail.

Figure 14:
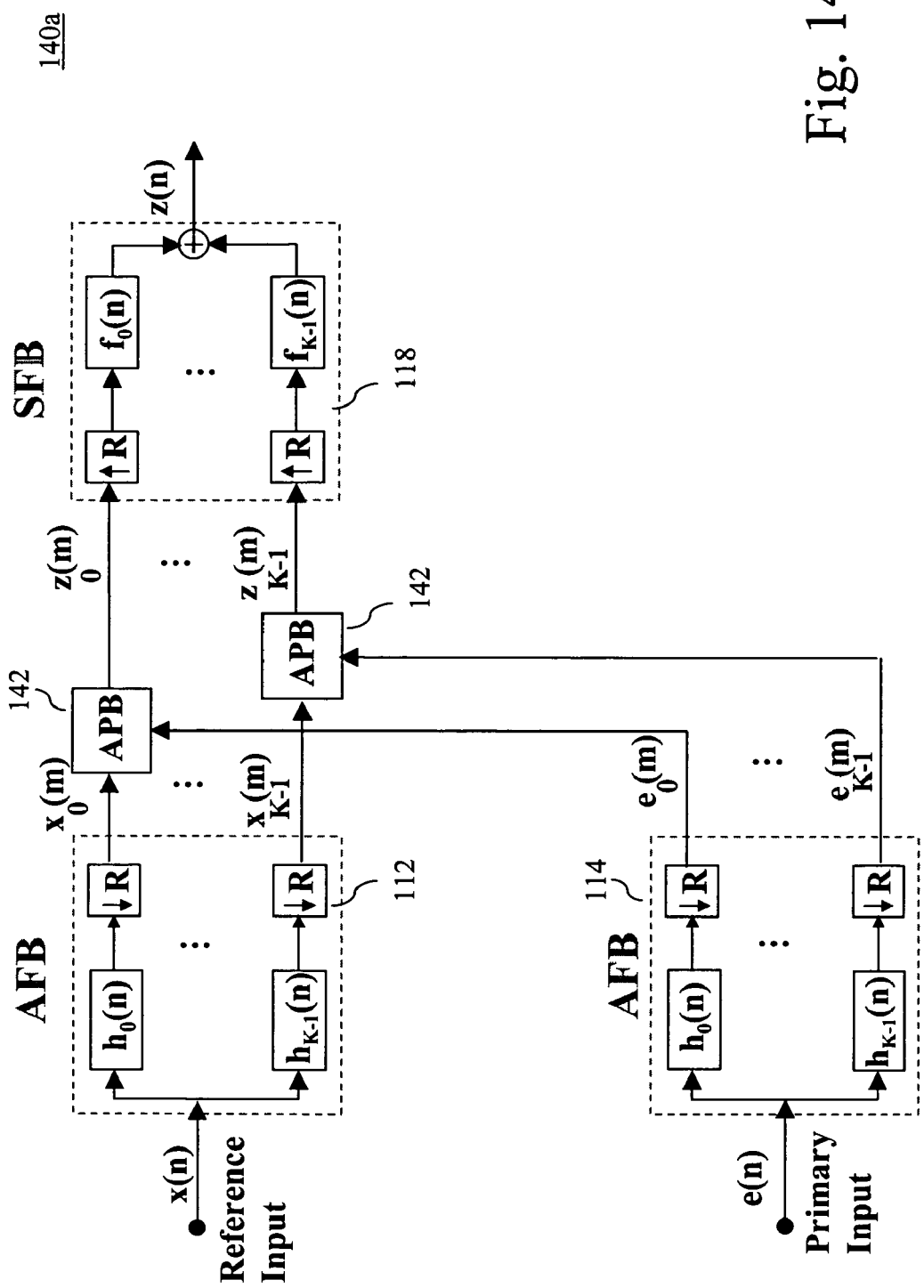
FIG. 14 is a diagram showing a conventional OS-SAF system.

FIG. 14 illustrates a conventional OS-SAF system 140a. The OS-SAF system 140a includes the over-sampled analysis filterbanks 112 and 114, subband adaptive processing blocks (APBs) 142, and the over-sampled synthesis filterbank 118. The OS-SAF system 140a has two inputs, i.e., a primary input e(n) (e.g., the error microphone signal in the ANC systems of FIGS. 2-5), and a reference input x(n) (e.g., the reference signal in the ANC systems of FIGS. 2-5). The reference inputs leaks into the primary input for example by going through an acoustic plant P(s) in FIGS. 2-5. As a result, the primary and reference inputs become correlated. The OS-SAF system 140a tries to eliminate the portion of the primary input that is correlated with the reference input through adaptive filtering.

Figure 15:
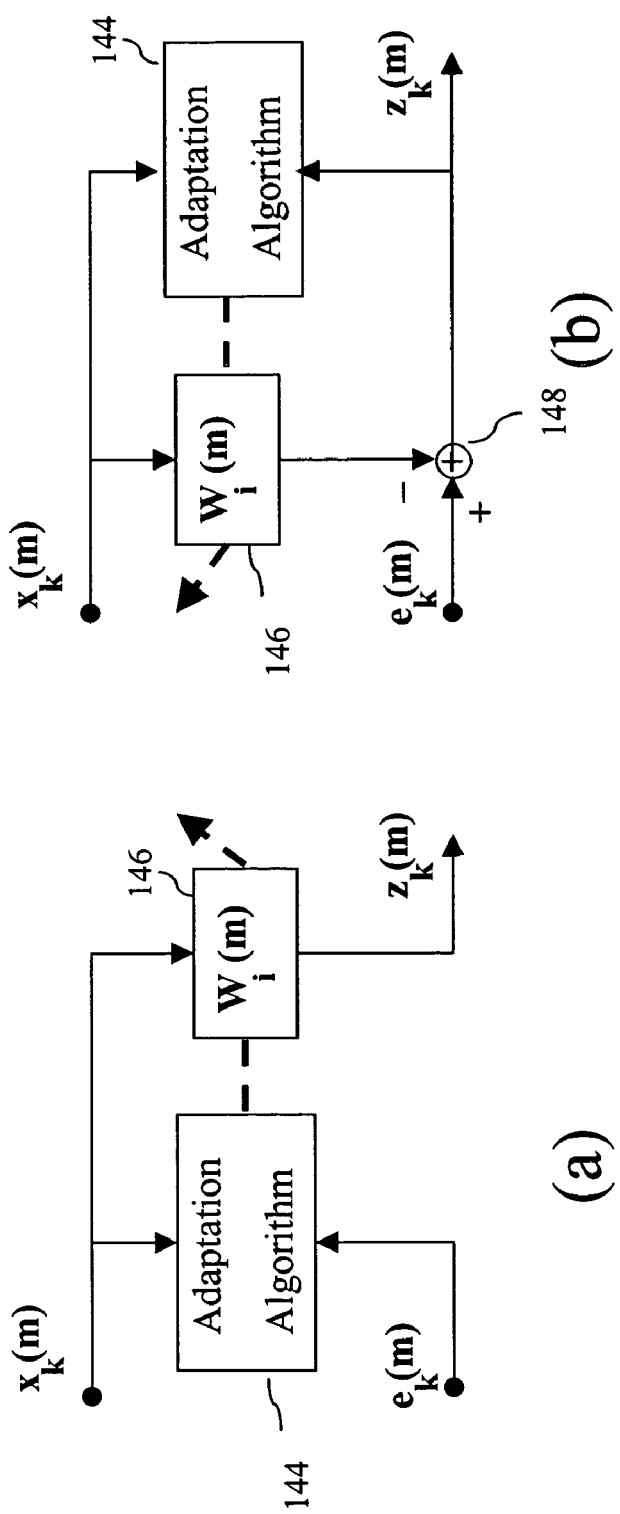
FIGS. 15(a)-(b) are diagrams showing examples of an adaptive processing block (APB)

FIGS. 15(a)-15(b) illustrate examples of adaptive processing. The APBs of FIGS. 15(a)-15(b) are applicable to APB 142 of FIG. 14. The APB of FIG. 15(b) contains a summation node 148, while the APB of FIG. 15(a) lacks the summation node 148.

The APB of FIG. 15(a) is applicable to the ANC applications, such as the FX-LMS method of FIGS. 2-6. The summation node 146 is rather transferred to the acoustic domain as shown in the ANC systems of FIGS. 2-6. The APB of FIG. 15(b) is applicable to applications, such adaptive interference (echo or noise) cancellation. Here the interference signal is cancelled in the digital domain through the adaptive algorithms 144. Both of the two APBs in FIGS. 15(a)-(b) could be equally used in the embodiment of the present invention disclosed here. For brevity, it is assumed that in the description below, the APB 142 has the form of FIG. 15(b), unless otherwise stated.

An example of the disclosed time-filter reconstruction through WOLA synthesis is described for an echo cancellation application as follows.

As disclosed in U.S. Patent application Publication Nos. 20030108214 and No. 20040071284 (Ser. Nos. 10/214,057 and 10/642,847), which are incorporated herein by reference, the over-sampled analysis and synthesis filterbank operations can be efficiently implemented using the WOLA analysis and synthesis, respectively. WOLA analysis/synthesis for over-sampled filterbank analysis/synthesis is disclosed in U.S. Pat. Nos. 6,236,731 and 6,240,192, which are incorporated herein by reference. FIG. 16 illustrates an OS-SAF system 140b having WOLA analysis filterbanks 132 and 134 and a WOLA synthesis filterbank 138.

FIG. 17 illustrates an OS-SAF system 150a in accordance with a further embodiment of the present invention. In the system 150a, the subband adaptive filters $W_k(n)$ are combined together through the filterbank synthesis process to obtain a time-domain adaptive filter W(z) 154 of W (n). The adaptive filter W(z) 154 receives the reference input x(n). The output of the adaptive filter W(z) 154 and the reference input e(n) are summed at 156.

Figure 18:
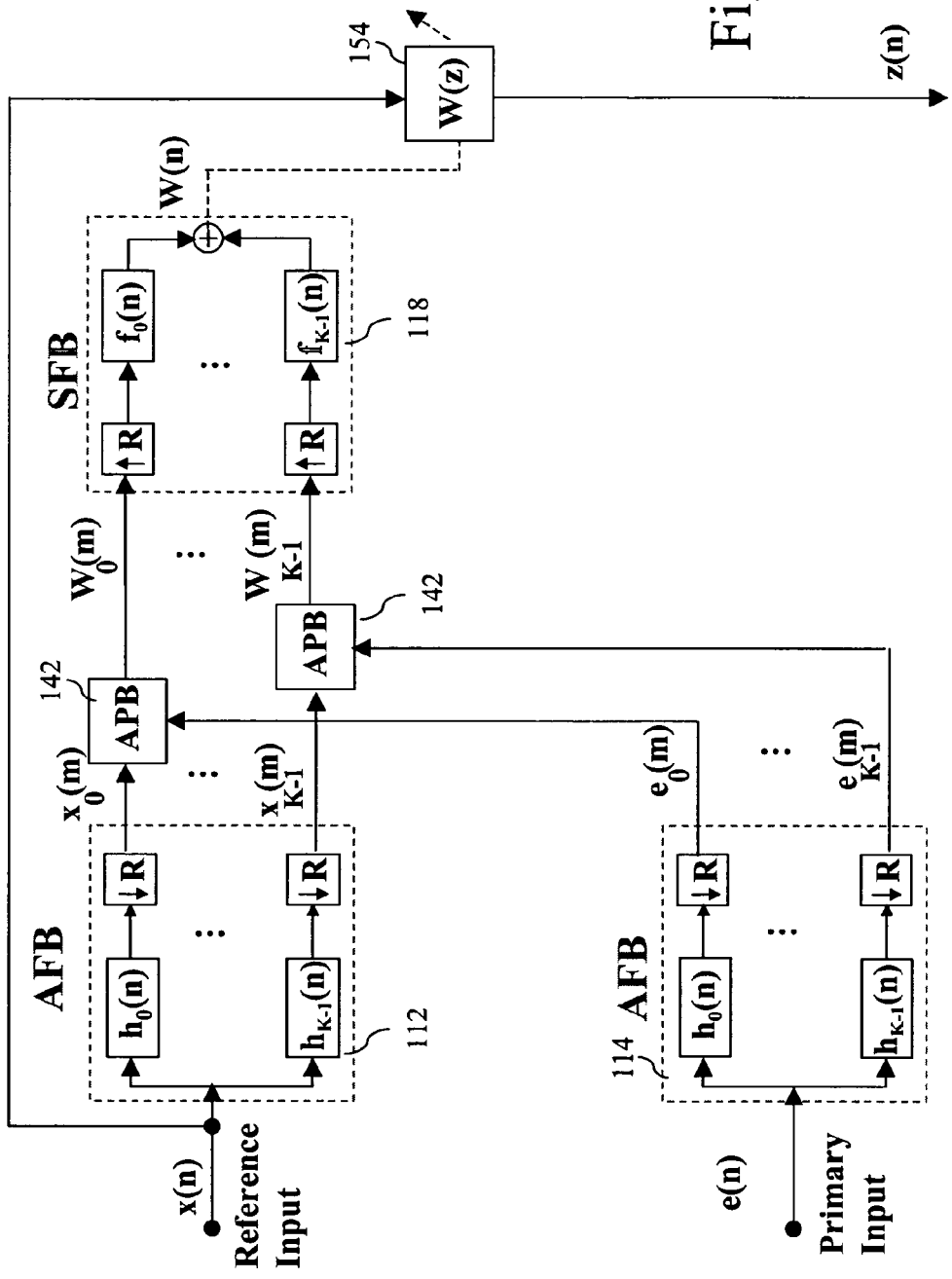
FIG. 18 is a diagram showing an OS-SAF system using over-sampled subband processing in accordance with a further embodiment of the present invention.

FIG. 18 illustrates an OS-SAF system 150b in accordance with a further embodiment of the present invention. In the AFBs 142 of the system 150b, the AFB of FIG. 15(b) is employed.

FIG. 19 illustrates an OS-SAF system 150c in accordance with a further embodiment of the present invention. The system 150c corresponds to the system 150a of FIG. 17, and utilizes the WOLA filterbank. As illustrated in FIG. 19, the WOLA synthesis could be used to efficiently synthesize the time-domain adaptive filter. The WOLA synthesis process includes steps disclosed in U.S. Pat. Nos. 6,236,731, 6,240,192 and 6,115,478.

Figure 20:
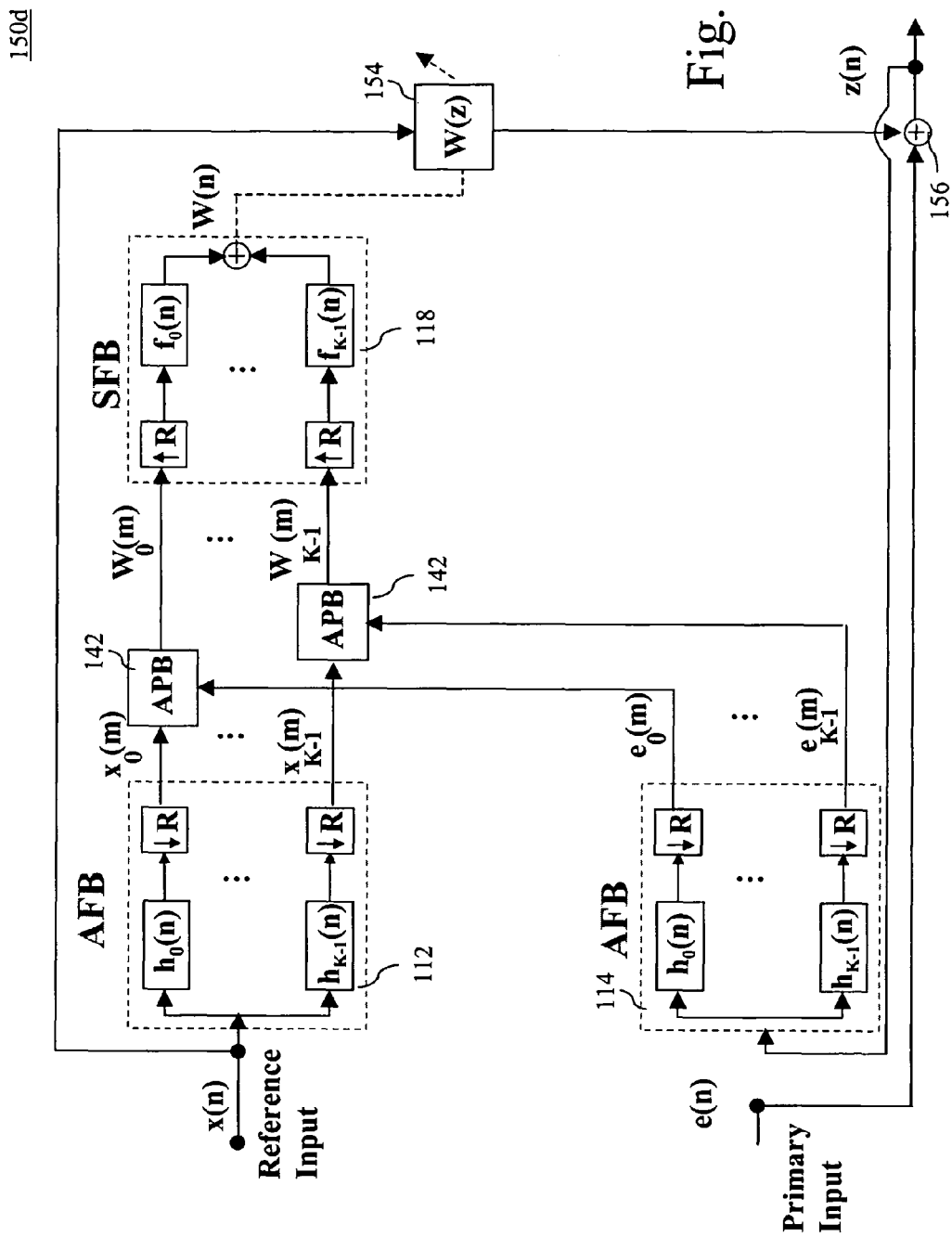
FIG. 20 is a diagram showing a closed-loop OS-SAF system using over-sampled subband processing in accordance with a further embodiment of the present invention.
Figure 21:
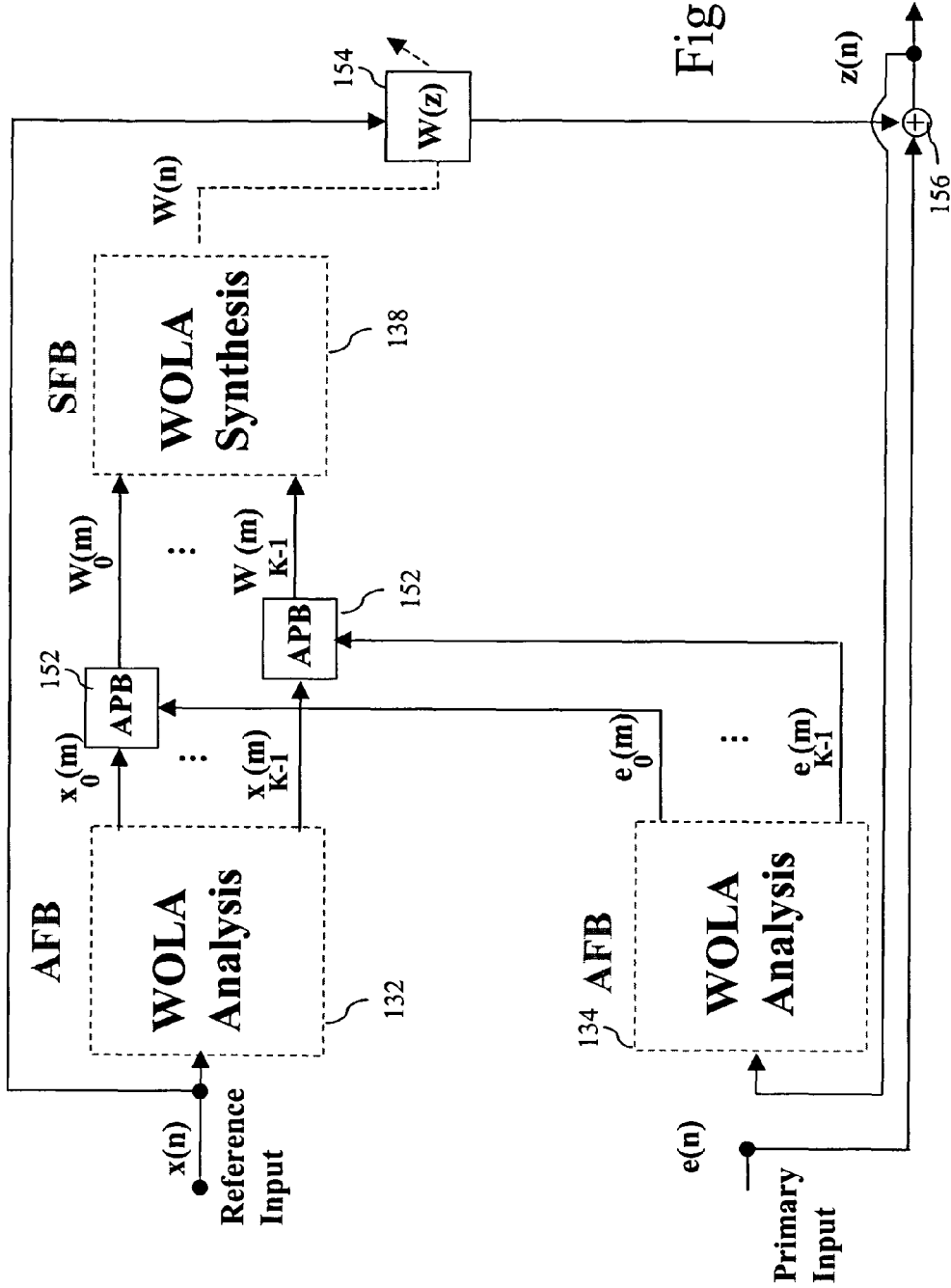
FIG. 21 is a diagram showing a closed-loop OS-SAF system using WOLA in accordance with a further embodiment of the present invention.

Closed-loop versions of the OS-SAF systems disclosed above are also possible. FIG. 20 illustrates a closed-loop version of the system 150a in FIG. 17, and FIG. 21 discloses a closed-loop version of the system 150c in FIG. 19. The feedback systems 150d and 150e of FIGS. 20-21 offer steady-state performance, since the final error signal is sensed back by the system and optimally eliminated.

FIG. 22 illustrates a delayless WOLA-based subband feedback ANC system using a FX-LMS in accordance with a further embodiment of the present invention. The system 150h of FIG. 22 corresponds to the system 50d of FIG. 8, and utilizes the WOLA filterbank.

A. Filter Reconstruction for Low-Resource Delayless Subband Adaptive Filter using WOLA Method and system for reconstruction of a time-domain adaptive filter (TAF) by using WOLA synthesis method (implemented with an oversampled filterbank) is described in detail. An inverse fast Fourier transform (IFFT) of length K is employed in the method. Due to the nature of the WOLA synthesis, the reconstruction process is distributed in time rendering it suitable for real-time implementation. The method is arranged such that segments of the TAF may be used as they become available in time. This makes the method a perfect match for sequential partial update algorithms (described later) that are often integral parts of low-resource implementations. The WOLA synthesis of the subband filters described below is efficiently implemented on an over-sampled filterbank that also benefits from the WOLA implementation for its analysis stage. The system is designed and described for an echo cancellation set up though it could be used for other adaptive applications such active noise cancellation or adaptive feedback cancellation.

A-1. WOLA Synthesis for Filter Reconstruction

Figure 23:
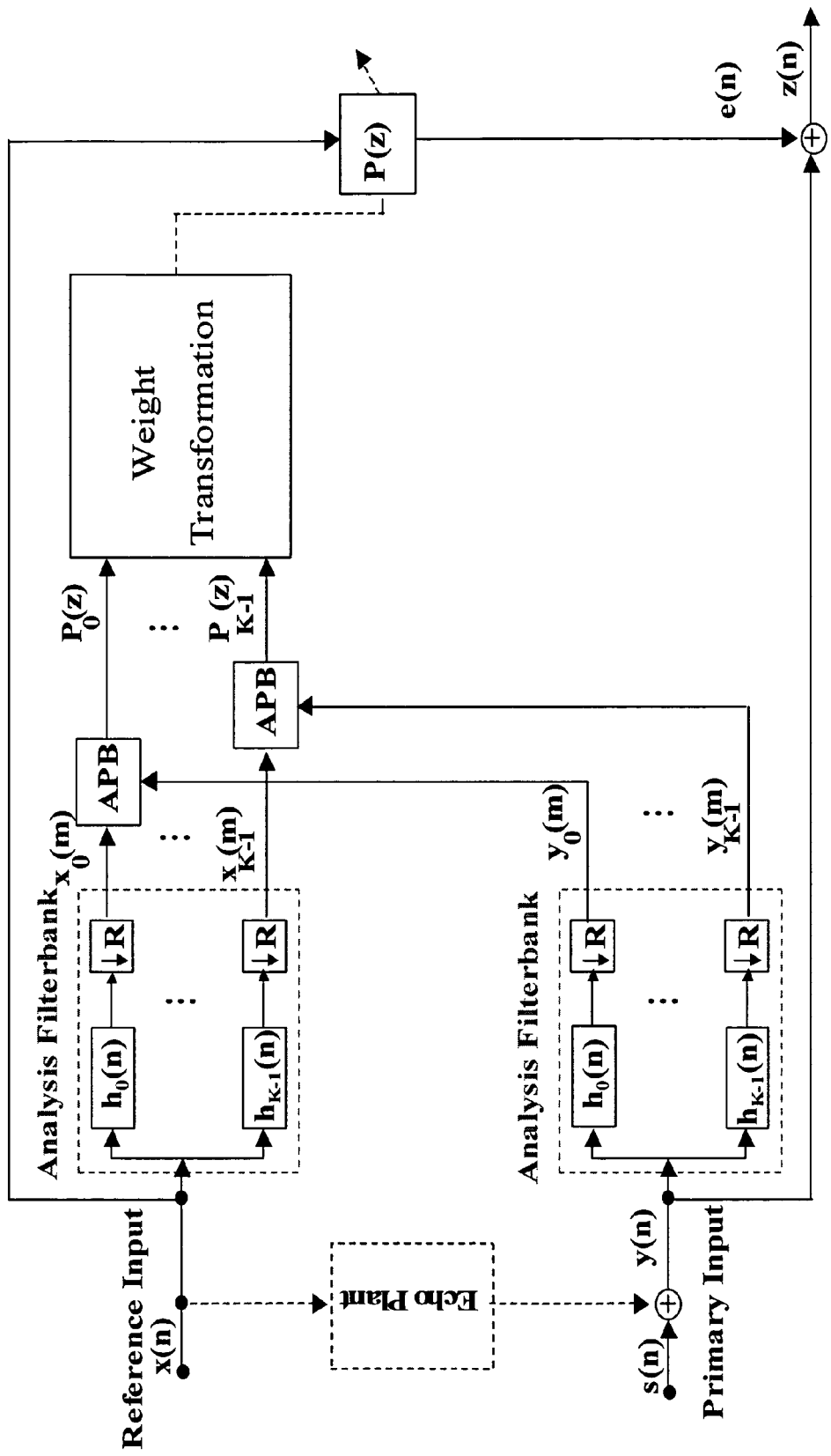
FIG. 23 is a diagram showing a delayless SAF system using oversampled filterbanks, employing weight transform for time-filter reconstruction.

FIG. 23 illustrates a delayless SAF structure with echo plant. At the output of APBs of FIG. 23, the sub-band adaptive filters $P_k(z)$, k=0,1, . . . , K−1 are obtained. Rather than reconstructing the output signal as in typical SAF systems, the adaptive filters are passed to a weight transformation stage to obtain the time-domain adaptive filter P(z) to be used to filter the reference signal x(n) in the time-domain. Assuming a synthesis filter set, in the DFT-FIR approach the TAF is obtained by passing the SAFs through a synthesis filterbank as described by the J. Huo reference and the L. Larson reference:

$$P(z) = \sum_{k=0}^{K-1} F_k(z) P_k(z^R) z^{Ls/2}$$

where R is the filterbank decimation factor, and $F_0(z)$ is the prototype filter of the filterbank, bandlimited to π/R. Synthesis filters are obtained through discrete Fourier transform (DFT) modulation of the prototype filter as $F_k(z)=F_0(zW^k)$ where $W=e^{-j2\pi/k}$. The term $z^{Ls/2}$ is added to compensate for delay of the synthesis filter of length Ls.

Figure 24:
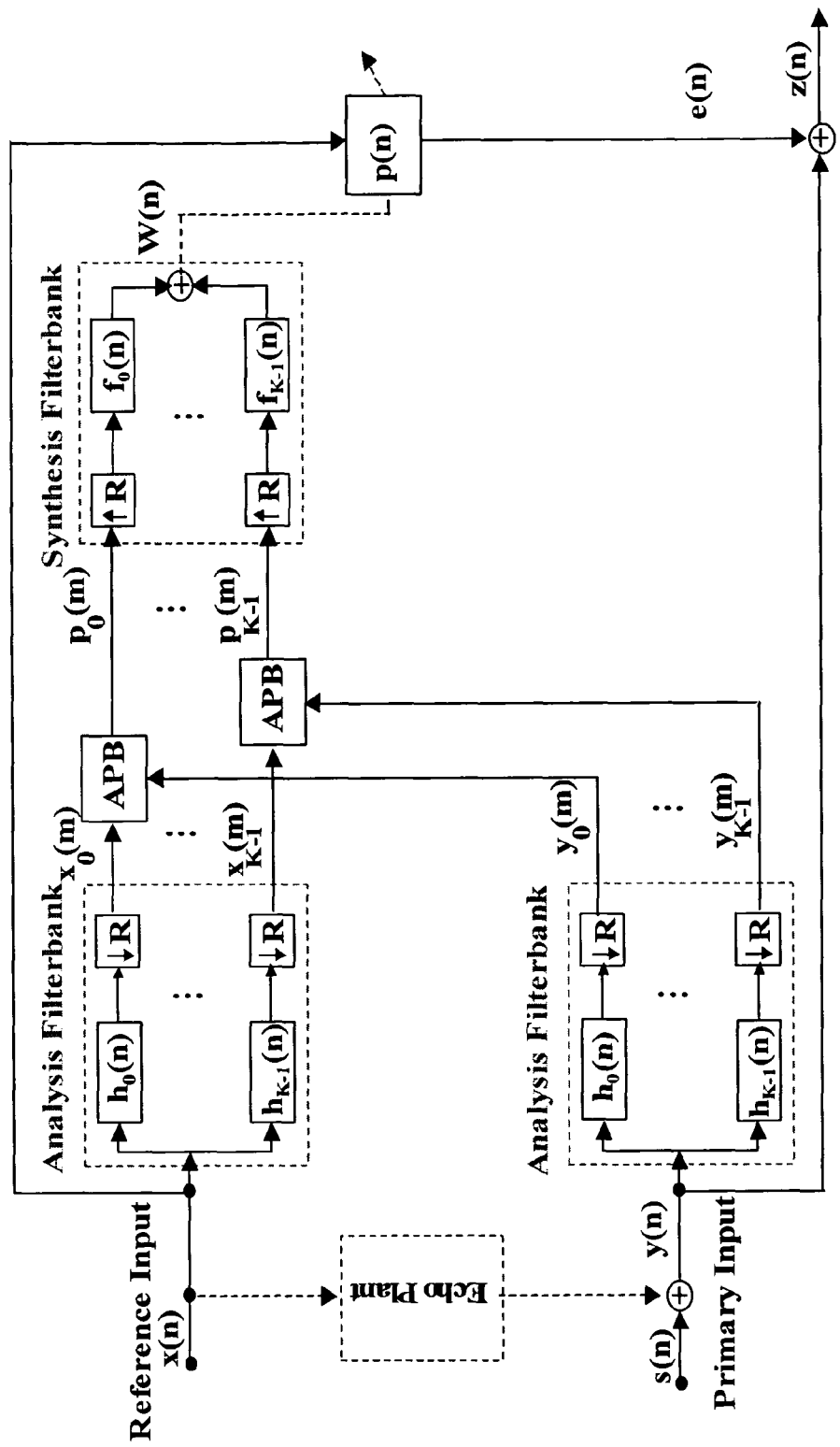
FIG. 24 is a diagram showing a Reconstruction of TAF through WOLA synthesis of the SAFs in accordance with a further embodiment of the present invention.
Figure 25:
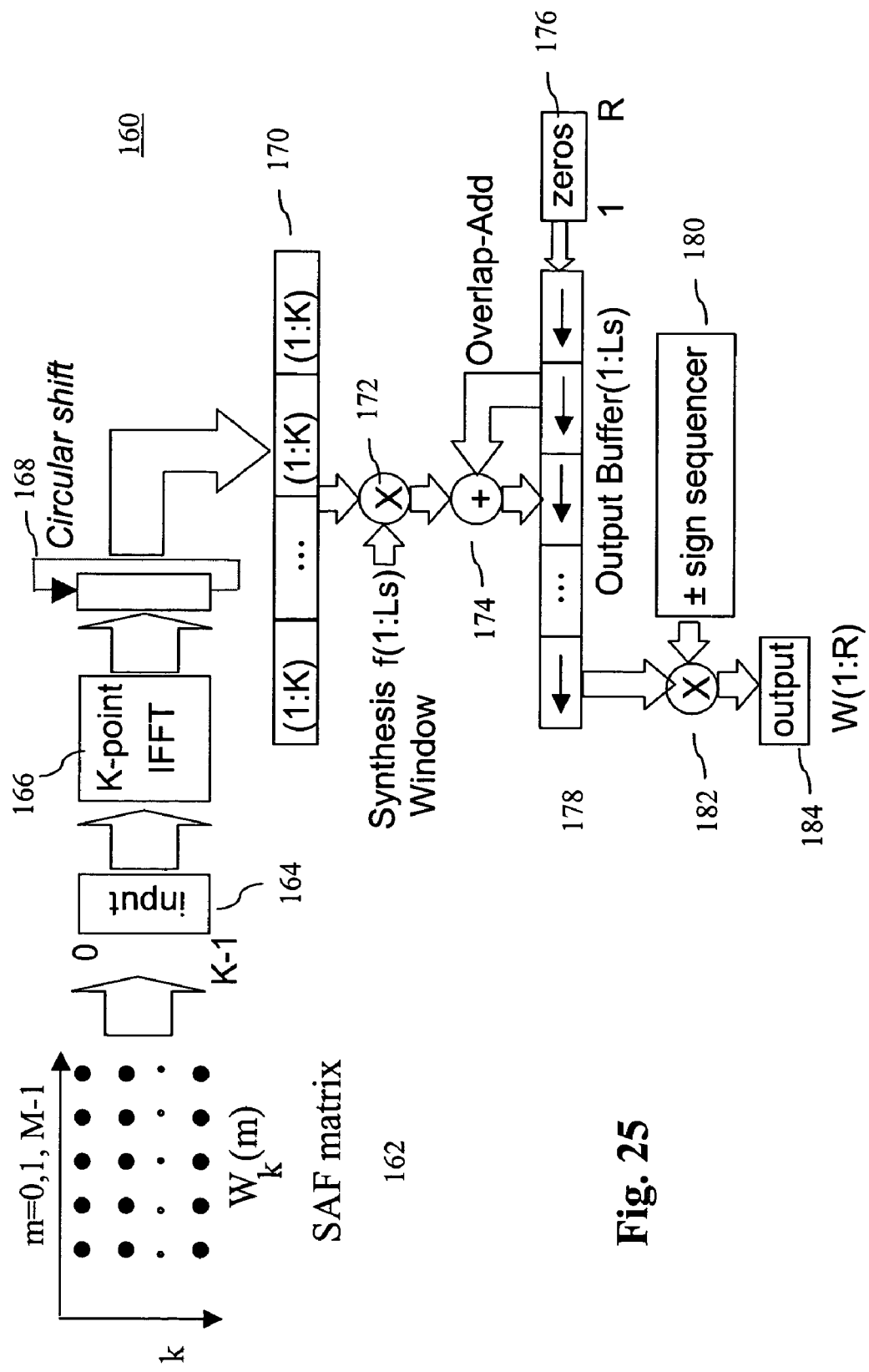
FIG. 25 is a diagram showing details of time-filter reconstruction using the WOLA process.

The DFT-FIR uses a polyphase-FFT structure to reconstruct the TAF through a weight transform of the SAF set. By contrast in this section, a different approach is described whereby the TAF is reconstructed through a WOLA synthesis of the SAFs. This method is more amenable to a block processing approach and more compatible to hardware implementation. Basically, this method treats the SAFs $p_k(m)$, k=0, 1, . . . ,K−1, m=0,1, . . . , M−1 as a set of K subband signals, and passes them through an oversampled filterbank synthesis stage as shown in FIG. 24. To efficiently implement the oversampled synthesis stage, we use the WOLA implementation as depicted in FIG. 25. For further explanation, consider the SAFs all included in an SAF matrix P ,with elements defined as $P(k,m)=p_k(m)$, m=0,1, . . . ,M−1,k=0,1, . . . ,K−1. The matrix is set as input to the synthesis stage, one column at every subband time-tick. We call this method of TAF reconstruction "sequential synthesis". As depicted in FIG. 25, the WOLA synthesis starts with taking an IFFT of each column (of length K) of the SAF matrix. After the IFFT 166, and proper circular shifting 168, the vectors of length K are periodically extended to obtain a vector as long as the synthesis window. Next this result is multiplied by the synthesis window followed by an overlap-add operation. Both evenly-stacked FFT and oddly-stacked FFTs may be used. Odd stacking requires an extra sign sequencer to be employed at the final stage. The WOLA synthesis is well described in U.S. Pat. Nos. 6,236,731, 6,240,192 and 6,115,478. Assuming aliasing is low in the analysis stage, the SAFs can be shown to converge to the Wiener solution. As a result, the solution will be almost independent of the analysis filter design. Thus the synthesis filter set $F_k(z)$, k=0,1, . . . ,K−1 is designed independently of the analysis filter set to constitute a near perfect-reconstruction set. To obtain the TAF, the output buffer 168 in FIG. 25 is first zeroed out. After reading in the input SAF matrix (one column per subband clock tick), the first Ls/2 samples of the output are discarded. The next L output samples produced a block at a time (R time-samples) constitute the TAF. Thus it takes L/R input (subband) clock ticks to obtain the TAF. Through optimized implementation it became possible to avoid the initial Ls/2 sample delays between consecutive filter reconstructions. The total input-output delay for the TAF filter reconstruction is thus (La+Ls)/2 samples where La denotes the analysis window length. This delay is not seen in the signal path; rather the optimal filter for the reference and primary signals is delayed by this amount. When the echo plant varies slowly (relative to this reconstruction delay), this delay does not degrade the system performance. It is possible to minimize the delay by choosing shorter analysis and synthesis windows as long as distortions in the time-filter due to the reconstruction process are kept within a tolerable range.

In the conventional SAF systems shorter analysis/synthesis windows will lead to increased output signal degradation since all signals pass through the complete filterbank as described in H. SheiKhzadeh et al. ("Performance Limitations of a New Subband Adaptive System for Noise and Echo Reduction", *Proc. Of IEEE ICECS*, 2003). By contrast, in the delayless SAF system of FIG. 24, signals are passed through the analysis filterbank only to obtain the adaptive filter. As a result, the adverse effects of shorter analysis/synthesis windows on output signal quality is much less pronounced. It is also possible to further reduce the TAF reconstruction delay to only La/2 samples if one is ready to perform filterbank reconstruction of the whole SAF matrix P for every output block. We call this method of TAF reconstruction "batch synthesis" as opposed to the "sequential synthesis" described in this section. Batch synthesis will increase the computation cost from a single WOLA synthesis (per output block) in the sequential synthesis to M WOLA synthesis operations. It is also possible to sequentially reconstruct more than one (but less than M) columns of matrix P at every subband time-tick if the computational resources permit.

A-2 System Evaluation

We evaluate the WOLA filter reconstruction process for a filterbank set up of: analysis and synthesis window lengths of La=64, and Ls=128 samples with K=16 subbands and decimation rate of R=4. The analysis filter is shorter in length (and wider in frequency domain) compared to the synthesis filter. This was chosen to provide better excitation in the analysis filter transition region leading to better convergence behavior as reported by P. L. De Leon II et al ("Experimental Results with Increased Bandwidth Analysis Filters in Oversampled, Subband Acoustic Echo Cancellers," *IEEE Sig. Proc. Letters*, January 1995, vol. 2, pp 1-3). Each SAF $p_k(m)$ is of length M=32 resulting in a 16×32 SAF matrix P. For comparison, the same filterbank setup was also employed for the oversampled SAF system with the WOLA implementation depicted in FIG. 26. The echo plant was the eighth plant of the ITUT G. 168 standard (Recommendation ITU-T G. 168, Digital Network Echo Cancellers, Int'l Telecommunication Union, 2000), the Echo Return Loss (ERL) was 10 dB, and random white noise was used at the reference input without any near-end disturbance.

For subband adaptation, the Gauss-Seidel Pseudo-Affine Projection (GS-PAP) (Albu et al., "The Gauss-Seidel Pseudo Affine Projection Algorithm and its Application for Echo Cancellation," 37th *Asilomar Conf Sig. Sys. & Comp.*, Pacific Grove, Calif., Nov. 2003) with an affine order of two was employed. The method provides fast convergence and is simple enough to be targeted for a low-resource real-time implementation. GS-PAP may be superior to the Fast Affine Projection Algorithm (FAPA) since unlike the FAPA that operates on a transformed adaptive filter, the GS-PAP directly provides the adaptive filter itself (the Albu et al. reference). To demonstrate the capability of the WOLA filter reconstruction algorithm in matching sequential update algorithms, sequential update GS-PAP (SGS-PAP) described in H. SheiKhzadeh et al. ("Partial update subband implementation of complex pseudo-affine projection algorithm on oversampled filterbanks", ICASSP, 2005 IEEE International Conference on Acoustics, Speech, and Signal Processing, Mar. 18-23, 2005, US) was also used for subband adaptation.

SGS-PAP employs sequential update of the adaptive filter in the framework of GS-PAP to reduce computation cost. The sequential decimation factor of the SGS-PAP was chosen to be eight (D=8). This means only one polyphase component (of length 32/8=4 taps) out of a total of 8 components of each SAF is adapted at each subband clock tick. For D=1, the SGS-PAP is obviously the same as GS-PAP. In the delayless algorithm, a block of R new samples of the TAF is available every subband tick. This new block is used to update the TAF as soon as it becomes available. This way a smooth and continuous filter reconstruction is achieved.

Figure 27:
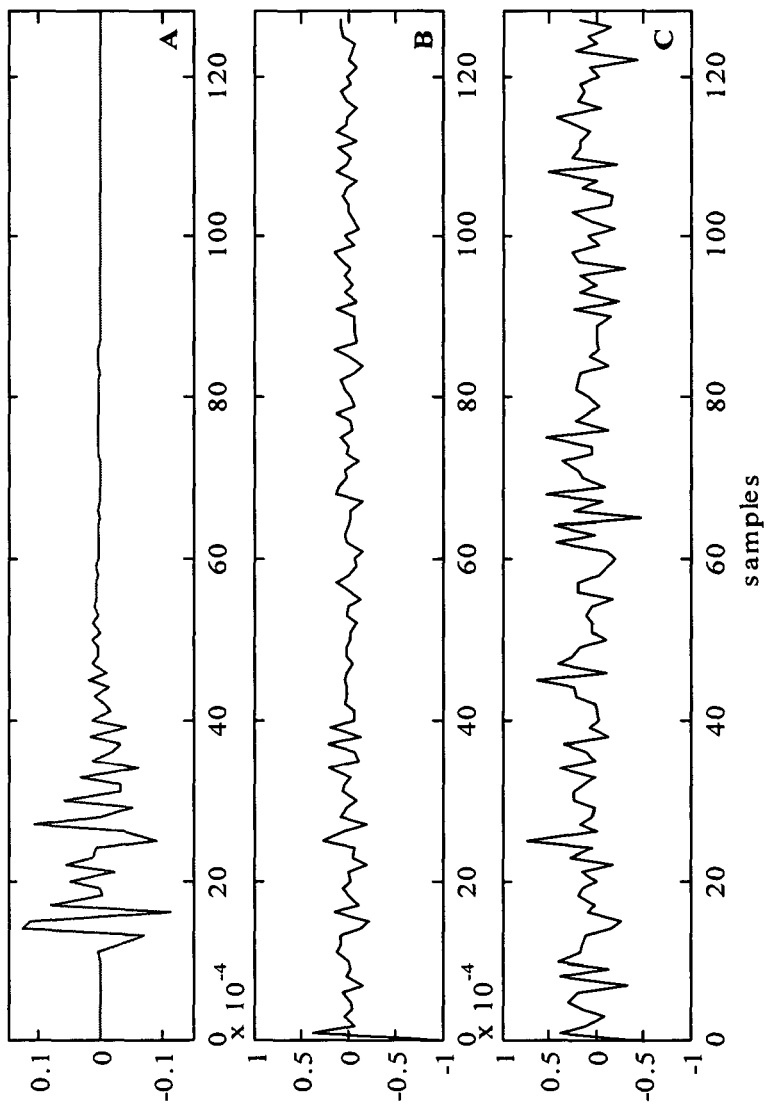
FIG. 27 is a graph for showing the simulation results of FIGS. 24-26.

FIG. 27 shows (A) Time-domain echo plant, and the reconstructed plant with SGS-PAP adaptation, for D=1,8, and (B) error in reconstructed TAFs for D=1 and (C) error for D=8

Figure 26:
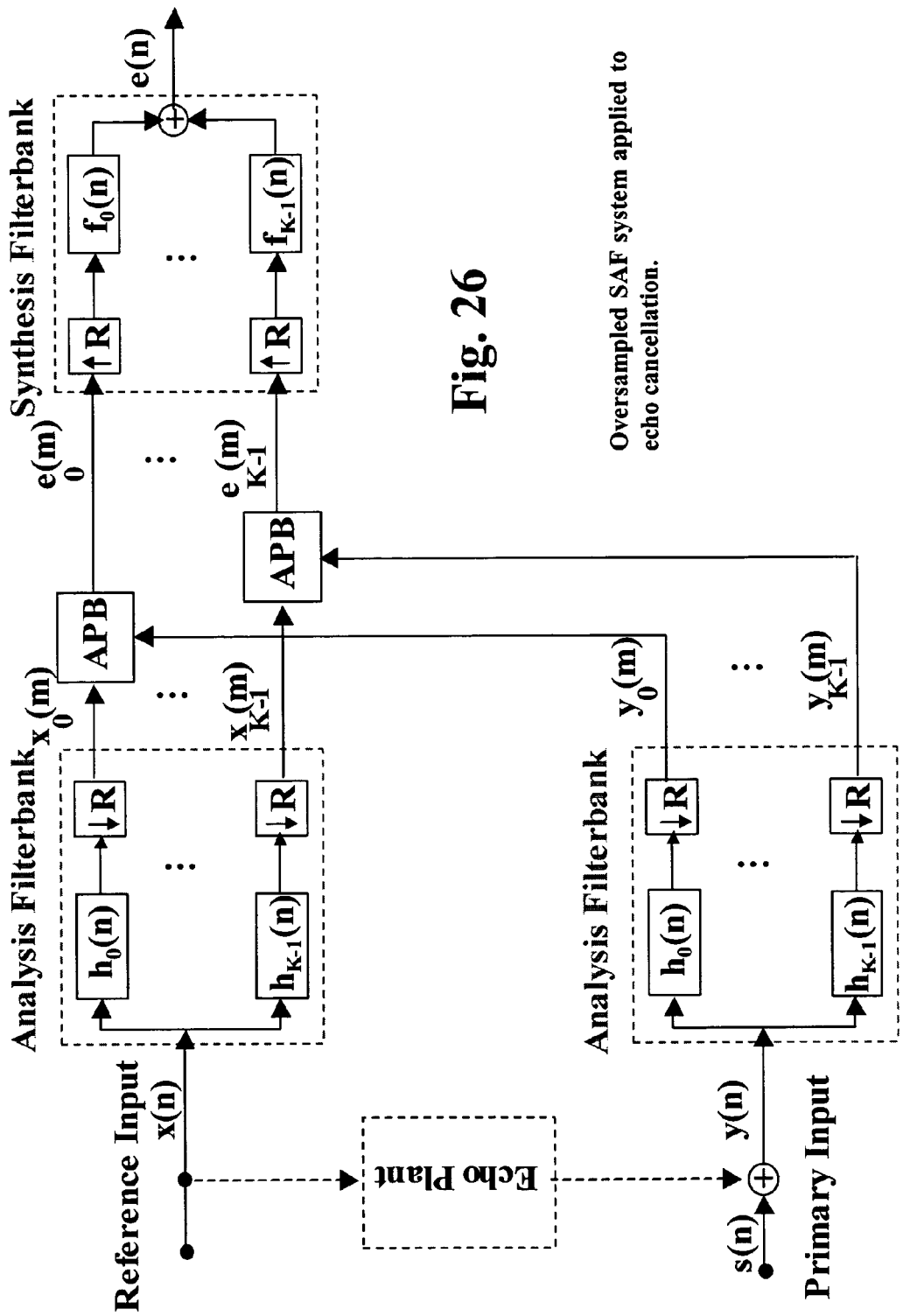
FIG. 26 is a diagram showing an oversampled SAF system applied to echo cancellation.

FIG. 27 illustrates the ERLE results for the SAF system of FIG. 26 as well as the delayless WOLA filter synthesis algorithm (FIGS. 24 and 25), employing SGS-PAP with D=1,8. As expected, the delayless method achieves a greater ERLE compared to the SAF system, partially due to the fact that the input signals are not passed through the WOLA analysis/synthesis stages. This is consistent with the result and analysis presented in the J. Huo reference and the L. Larson reference. The SGS-PAP method shows a slight performance degradation for D=8 (for both the SAF and the delayless methods) since the subband adaptive filters are updated at a much lower rate. Adaptation cost is, however, reduced by a factor of D=8.

Figure 28:
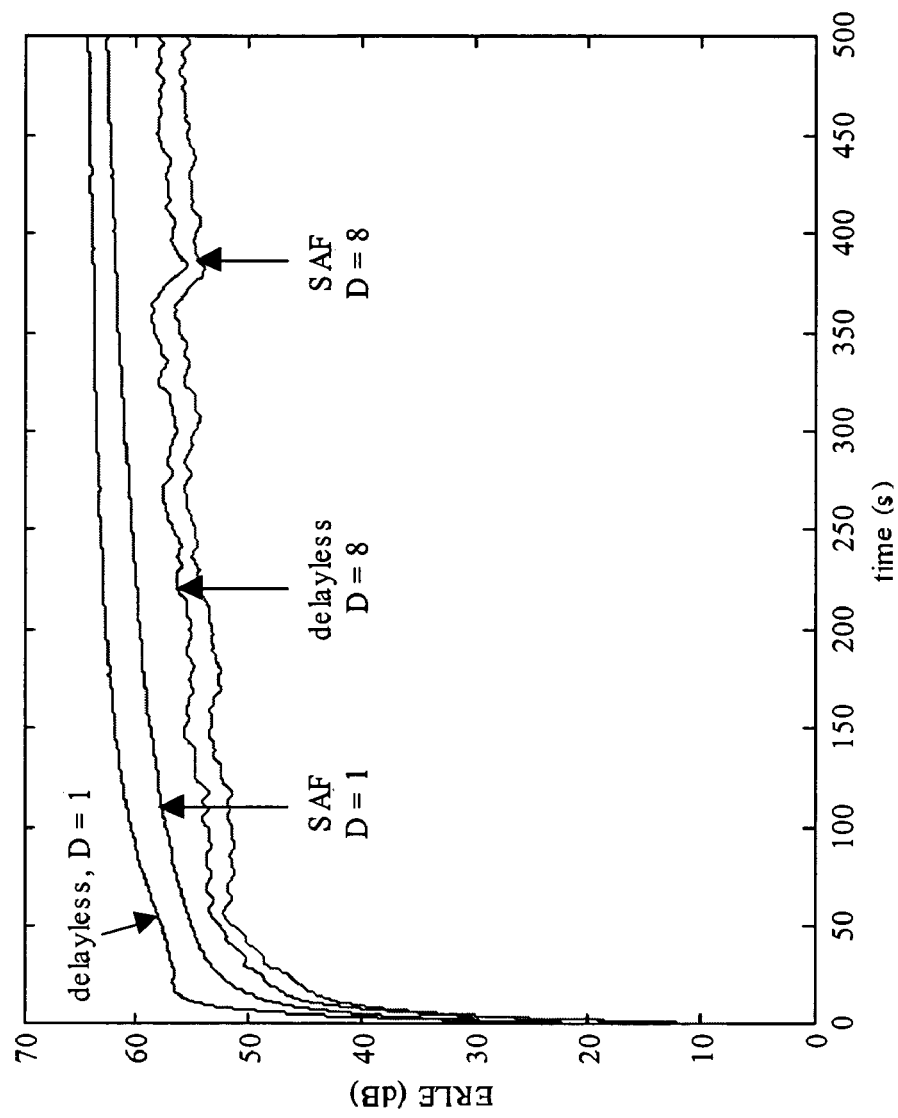
FIG. 28 is a graph showing the ERLE results.

FIG. 28 illustrates the ERLE results for SGS-PAP adaptation with D=1,8, for the SAF system of FIG. 26 and the delayless SAF algorithms of FIG. 24.

Using the WOLA synthesis, the TAF was synthesized. FIG. 27-A shows the synthesized time-filter for SGS-PAP adaptation with D=1,8, super-imposed on the ITUT plant. As shown the three impulse responses are almost identical. To observe the differences, FIGS. 27-B and 27-C depict time-domain differences between each of the synthesized time-filters and the ITUT plant for D=1,8. As shown, the differences are negligible in both cases, and higher for D=8 as predicted by the ERLE results.

The WOLA structure is more amenable with a block processing system (R. E. Crochiere et al. "Multirate digital signal processing", Prentice-Hall, NJ, 1983). As illustrated in FIG. 25, for every input vector, all the processes (after the IFFT) occur sequentially to generate R samples of output. All various blocks of FIG. 25 can thus operate synchronously with a single subband clock, and there is no need to extra buffering. Since the WOLA filterbank is a block processing system, every slice generated from the IFFT block that must be overlap-added to the previous results has a common exponent. This simplifies the architecture, reducing power and enhancing throughput as described in U.S. Pat. Nos. 6,236,731, 6,240,192 and 6,115,478. The same does not hold for straightforward polyphase implementation of the J. Huo reference since it is a stream processing method. In the polyphase filterbank synthesis of the J. Huo reference, a separate convolution of one of polyphase synthesis filters (with one of the K subband signals) has to occur for each sample of output. To do this, K different data buffers have to be updated. To summarize, the WOLA synthesis of FIG. 25 provides a simpler, more modular structure for real-time hardware implementation as described in U.S. Pat. Nos. 6,236,731, 6,240,192 and 6,115,478.

The method, based on WOLA synthesis of the SAFs, is efficient and is well mapped to a low-resource hardware implementation. Also the WOLA adaptive filter reconstruction may easily be spread out in time simplifying the necessary hardware. This time-spreading may be easily combined with partial update adaptive algorithms to reduce the computation cost for low-resource real-time platforms.

A-3 Filter Reconstruction and Evaluation

An example for reconstruction by WOLA is described, using WOLA setup of analysis window length of L=128, with K=32 subband, and decimation rate of R=8. Assume (without loss of generality) that APB's are of the form illustrated in FIG. 15(b) employed for an echo cancellation application. The collection of K SAFs for subbands k=0,1, ..., K-1 is shown in FIG. 25. Each SAF $W_k(m)$ is of length M, n=0,1, ..., M-1 resulting in a K by M SAF matrix. The system 150c of FIG. 19 for echo cancellation is employed using the eighth plant of the ITUT G. 168 standard for echo generation. The reconstruction process of FIG. 25 was applied to this simulation.

Figure 29:
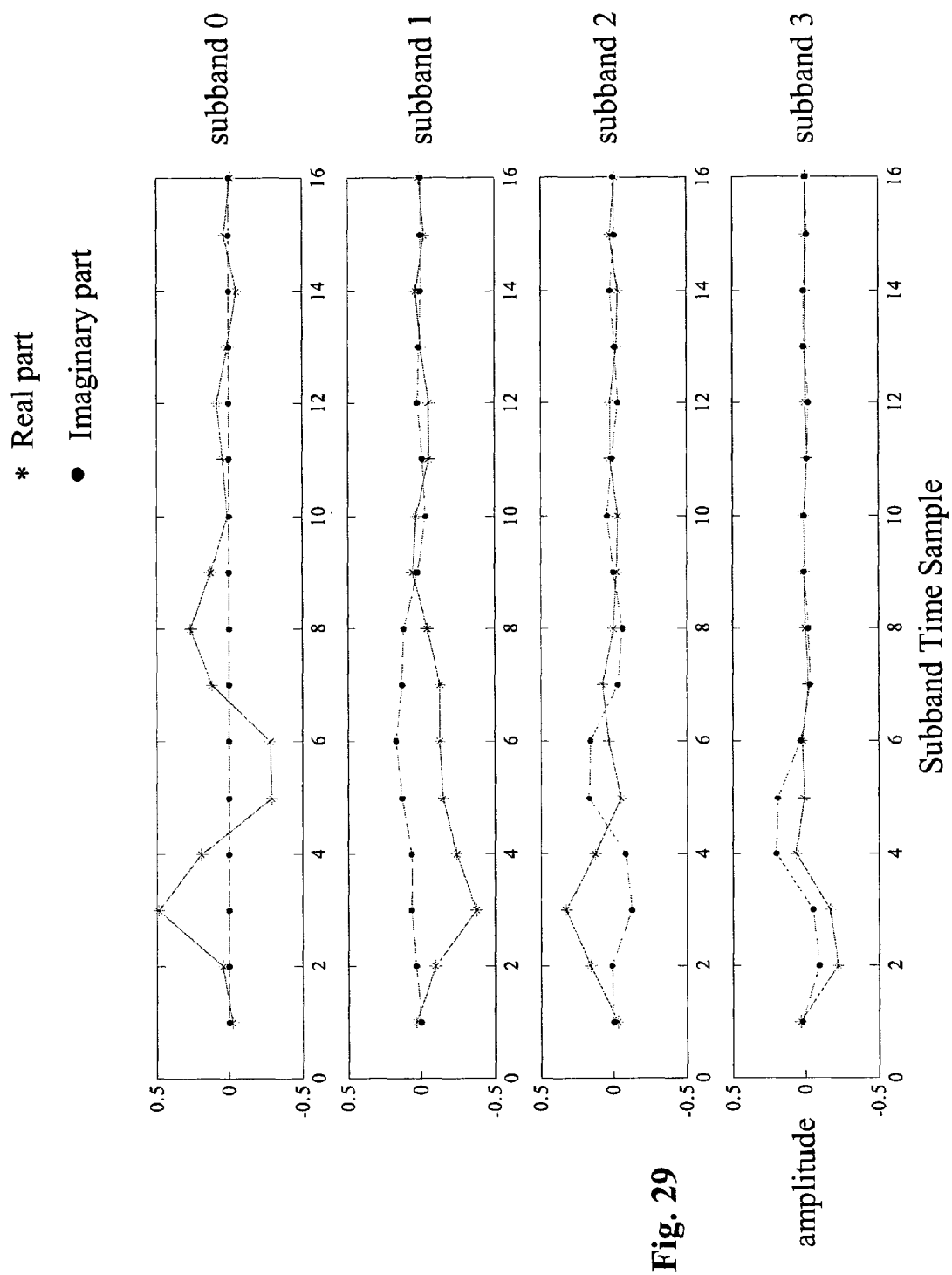
FIG. 29 is a graph showing an example of real and imaginary parts of SAFs.
Figure 30:
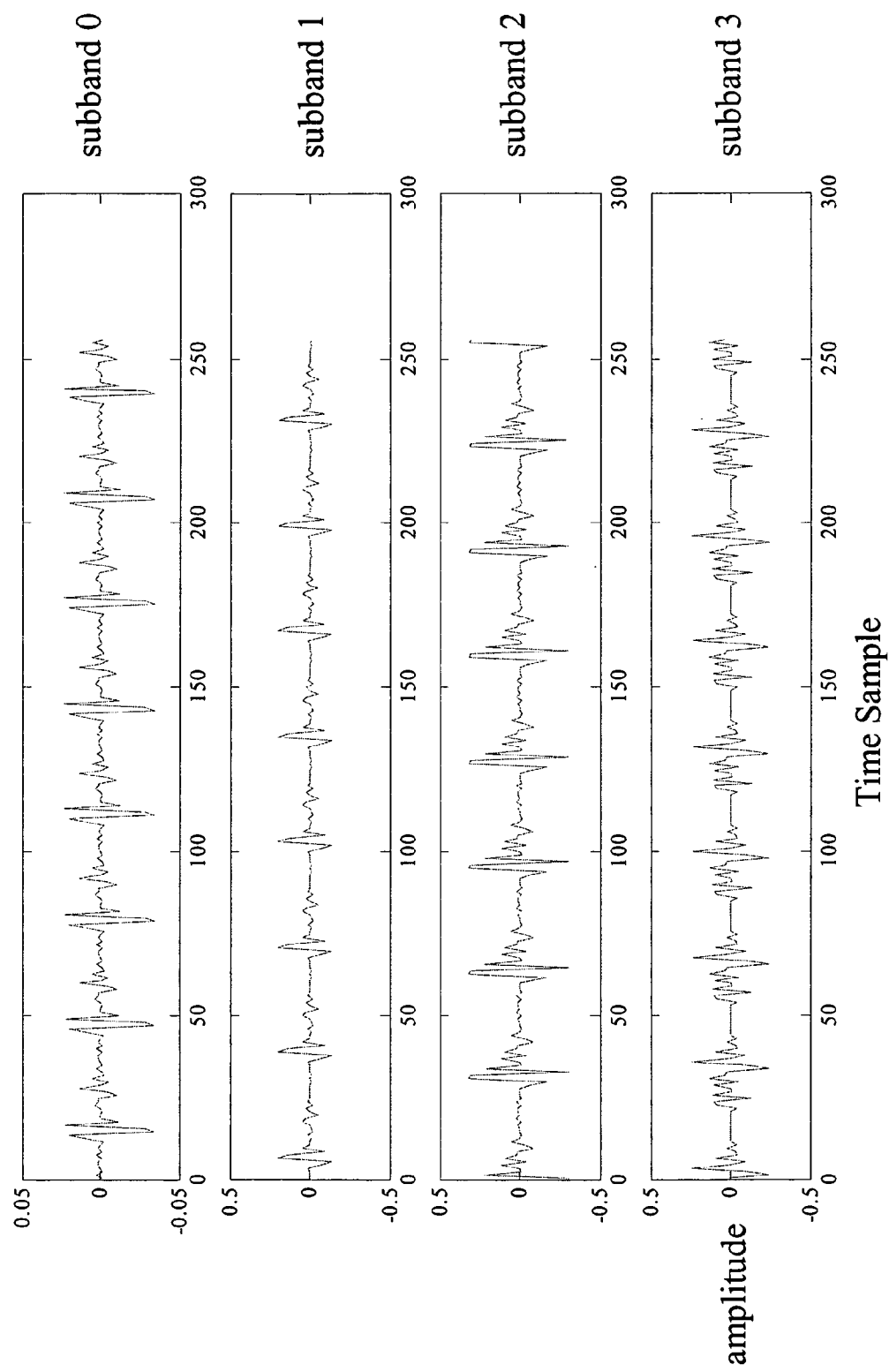
FIG. 30 is a graph showing an example of periodic extension of a WOLA synthesis.
Figure 31:
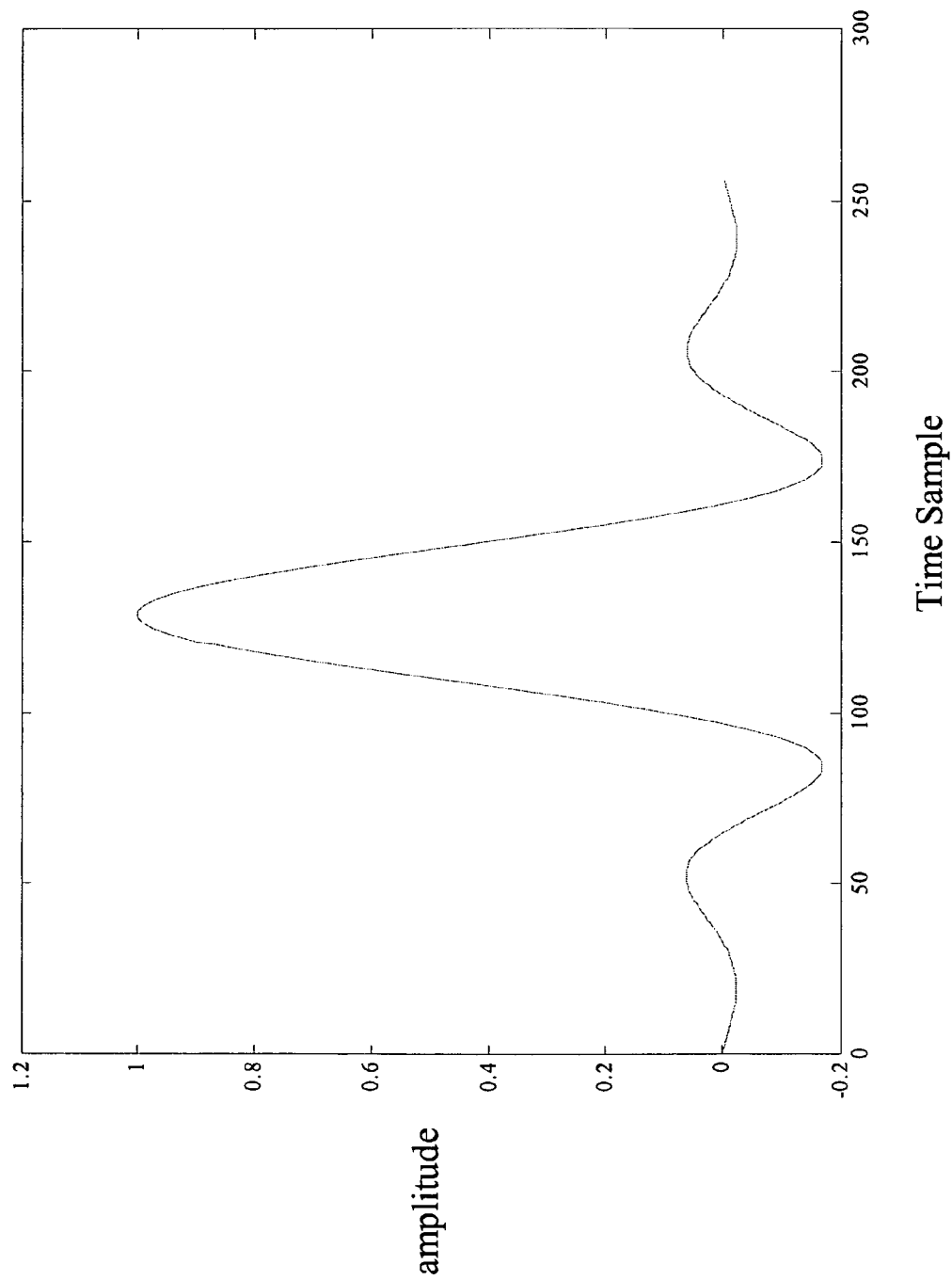
FIG. 31 is a graph showing an example of a synthesis window.
Figure 32:
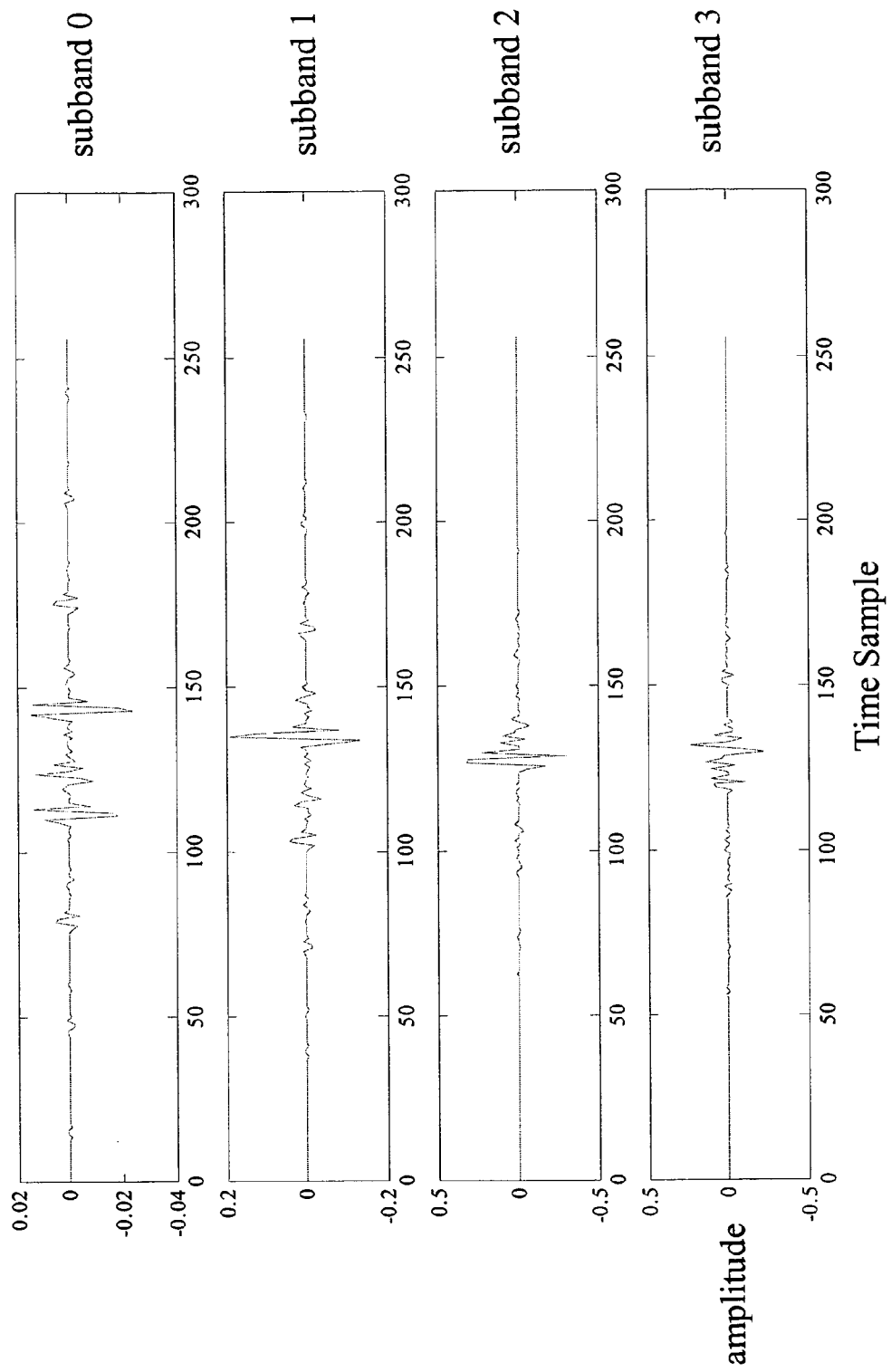
FIG. 32 is a graph showing the result of widow application of FIG. 31.
Figure 33:
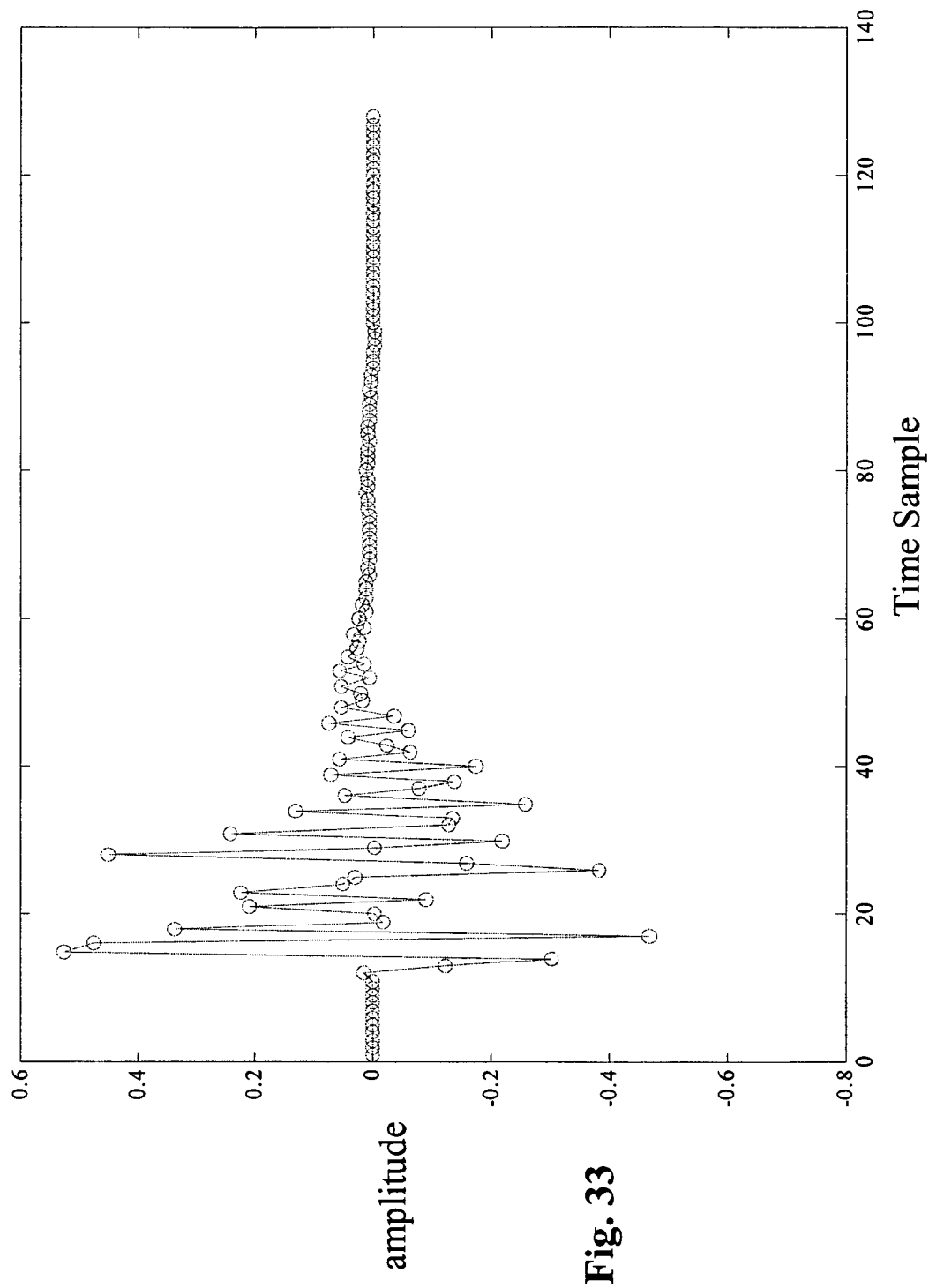
FIG. 33 is a graph showing an example of time sample for synthesizing a time-domain filter.
Figure 34A:
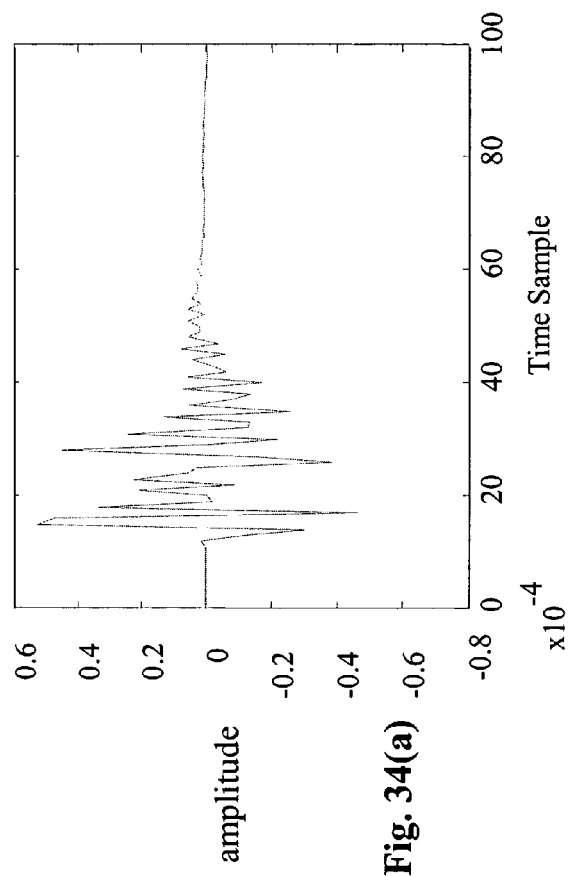
FIG. 34(a) is a graph showing an example of time sample for a synthesized time-filter super-imposed on the ITUT plant.
Figure 34B:
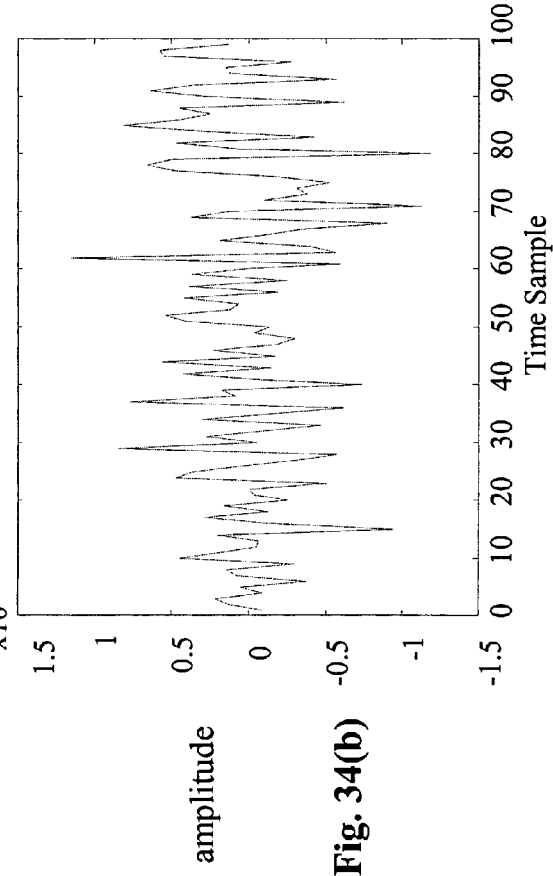
FIG. 34(b) is a graph showing an example of time-domain difference between the synthesized time-filter and the ITUT plant.

FIG. 29 shows an example of real and imaginary parts of SAFs for subbands k=0,1,2,3 for the subband adaptive system after convergence. Treating each SAF as a subband signal, the process of WOLA synthesis starts with taking the IFFT of each column (of length K) of the SAF matrix. There are M columns to be processed. After IFFT, and proper circular shifting, the vectors of length K are periodically extended to obtain vectors as long as the synthesis window. The result of periodic extension is shown in FIG. 30 for the SAFs shown in FIG. 29, where a total length of 256 samples (8 periodic extensions) is used. Then a synthesis window (of length Ls=256 samples) is applied to the periodically extended signals. A typical window is shown in FIG. 31 and the result of window application is shown in FIG. 32. The last step is the overlap-add of the vectors (a total of M vectors involved). Using a properly designed synthesis window, the time-domain filter is synthesized in time as shown in FIG. 33. FIG. 34(a) shows the synthesized time-filter super-imposed on the ITUT plant. As shown, the synthesized time-filter and the ITUT plant are almost identical. FIG. 34(b) illustrates the time-domain difference between the synthesized time-filter and the ITUT plant. As shown, the difference is negligible.

Figure 35:
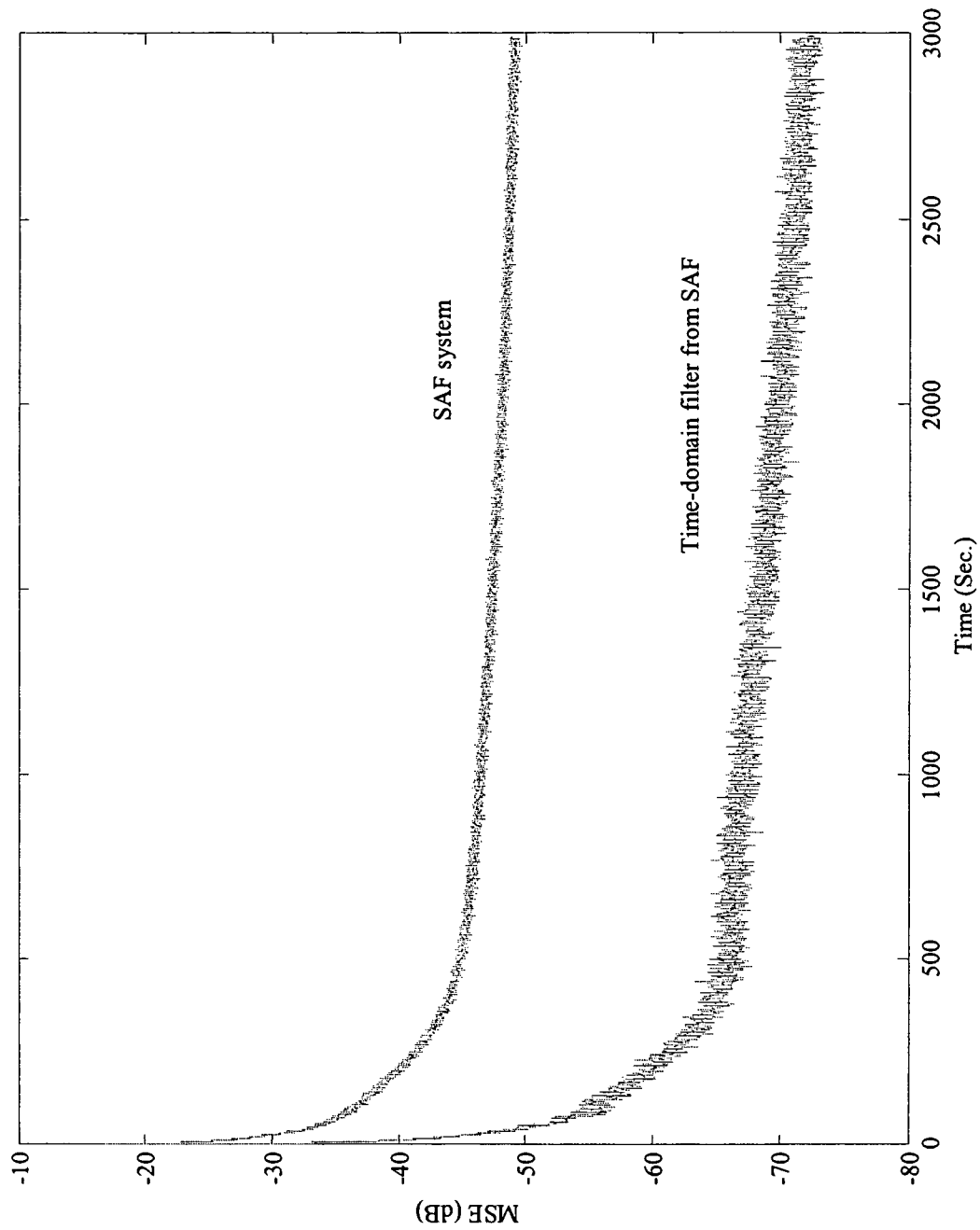
FIG. 35 is a graph showing echo attenuation of a time-domain filter and a conventional SAF.

The time-domain filter can be used for adaptive filtering. As illustrated in FIG. 35, for random noise input and the same ITUT plant, the echo attenuation of the time-domain filter is superior to the SAF filter using the NLMS algorithm. This is partially due to the fact that the input signal to the time-domain filter is not passed through the WOLA analysis stage (hence not experiencing distortions), as shown in FIG. 4.

It is noted that as for the method of adaptation of SAFs (e.g., NLMS 30, 58), the Normalized Least Mean Square (NLMS), the Affine Projection Algorithm (APA) and its variants such as Fast APA (FAPA), or the Recursive Least Squares (RLS) may also be used.

The corresponding Canadian Patent application No. 2,481,629 also describes reconstruction of TAF by WOLA, which is incorporated herein by reference.

The embodiments of the present invention reduces acoustic feedback and provide as high a degree of cancellation for periodic or other quasi-stationary signals.

The embodiments of the present invention automatically adapts to the different acoustic situations presented by different headsets and to the normal variations encountered in production parts.

As described above, over-sampled filterbank processing and system architecture disclosed in U.S. Pat. Nos. 6,240,192 B1, 6,236,731 B1, and 6,115,478 provide low group delay, low power and small size. The embodiments of the present invention can be efficiently implemented on the system architecture disclosed in U.S. Pat. Nos. 6,240,192 B1, 6,236,731 B1, and 6,115,478.

As described above, an analog ANC provides noise cancellation at predominantly low frequencies (below 1500 Hz to 2000 Hz). The embodiments of the present invention can extend this frequency range. The introduction of a DSP processor also permits additional processing to be incorporated, including techniques that can improve speech intelligibility at frequencies where even DSP enhanced analog ANC ceases to provide benefit, as described in U.S. Patent application Publication No. 20030198357 (Ser. No. 10/214,056). U.S. Patent application Publication No. 20030198357 discloses a sound intelligibility enhancement (SIE) using a psychoacoustic model and preferably an oversampled filterbank. When combined with ANC, the SE performs better since ANC provides more benefit at low frequencies while SE provides more benefit at high frequencies. Using the ANC , undesired dynamic range reduction is avoidable due to low-frequency noise.

The embodiments of the present invention disclosed above prevents acoustic feedback in a manner that retains high fidelity and good performance in the presence of typical disturbances. Subband acoustic feedback reduction is employed to extend the operating frequency range by permitting more loop gain to be introduced before the onset of acoustic feedback. This type of feedback cancellation introduces fewer artifacts than full band approaches for feedback cancellation. It also provides better performance in the presence of coloured noise (disturbances). Finally the reduced group delay (compared to a full band system with similar feedback cancellation performance) provides a faster response time for feedback cancellation.

As detailed in the U.S. Pat. No. 6,118,878, the brink of instability can be detected by finding the ratio of external to internal noise at high frequencies. Alternatively, the residual signal can be monitored at various frequencies to detect and prevent an impending instability. Employing an over-sampled filterbank provides more accurate and reliable prediction of impending instabilities. Generally, the overall control of the ANC system employing an over-sampled subband approach is more efficient, and accurate.

The delayless OS-SAF in accordance with the embodiments of the present invention considerably reduces the delay introduced in the primary signal path. Also, since the actual echo cancellation occurs in time-domain, inevitable distortions due to over-sampled filterbank analysis/synthesis is avoided. As the results demonstrate, the delayless SAF method proposed outperforms the traditional OS-SAFs in terms of adaptive noise and echo cancellation performance. This is possible due to avoiding errors due to band edges in the OS-SAF system.

The embodiments of the present invention provide a combination of OS-SAF and time-domain filtering. Comparing to a full band system with similar adaptive processing, this combination provides a faster convergence and response time of the adaptive system.

The embodiments of the present invention may be implemented by hardware, software or a combination of hardware and software having the above described functions. The software code, either in its entirety or a part thereof, may be stored in a computer readable medium. Further, a computer data signal representing the software code which may be embedded in a carrier wave may be transmitted via a communication network. Such a computer readable medium and, a computer data signal and carrier wave are also within the scope of the present invention, as well as the hardware, software and the combination thereof.

All citations are hereby incorporated by reference.

The present invention has been described with regard to one or more embodiments. However, it will be apparent to persons skilled in the art that a number of variations and modifications can be made without departing from the scope of the invention as defined in the claims.

What is claimed is:

1. A system for active noise cancellation, comprising:
an analog active noise cancellation (ANC) system for performing an active noise cancellation to a primary signal in a time-domain, the primary signal being associated with an acoustic signal and comprising noise;
a first analysis filter bank for transferring a reference signal in the time-domain into a plurality of subband reference signals in a frequency-domain, the reference signal being associated with the noise;
a second analysis filter bank for transferring the primary signal in the time-domain into a plurality of subband primary signals in the frequency-domain;
a subband processing module for processing the plurality of subband reference signals, the plurality of subband primary signals or a combination thereof, including detecting the analog ANC system at brink of instability, and adjusting one or more parameters of the analog ANC system based on the processing, the subband processing module comprising:
a subband estimator for estimating a subband acoustic transfer function, the subband acoustic transfer function modelling conversion of an electrical signal into an acoustic domain signal, the subband estimator being applied to the plurality of subband reference signals;
a subband adaptive filter for providing a plurality of subband output signals in response to the plurality of subband reference signals;
an adjustor for adjusting the subband adaptive filter in response to the plurality of subband primary signals and the plurality of estimated subband reference signals; and
a synthesis filter bank for transferring the plurality of subband output signals to a time-domain output signal.

2. A system as claimed in claim 1, wherein:
the synthesis filter bank employs WOLA synthesis process to convert the plurality of subband output signals to the time-domain output signal.

3. A system for active noise cancellation, comprising:
an analog active noise cancellation (ANC) system for performing an active noise cancellation to a primary signal in a time-domain, the primary signal being associated with an acoustic signal and comprisinq noise;
an analysis filterbank for transferring the primary signal in the time-domain into a plurality of subband primary signals in a frequency-domain;
a subband processing module for processing the plurality of subband primary signals, including detecting the analog ANC system at brink of instability, and adjusting one or more parameters of the analog ANC system based on the processing, the subband processing module comprising:
a subband adaptive filter for providing a plurality of subband output signals in response to a plurality of subband reference signals;

a feed-back loop for adapting the subband adaptive filter, including:
- a first subband estimator for estimating a subband acoustic transfer function, the subband acoustic transfer function modelling conversion of an electrical signal into an acoustic domain signal, the first subband estimator being applied to the plurality of subband output signals;
- a signal path for generating the plurality of subband reference signals in response to the plurality of subband primary signals and the plurality of estimated subband output signals;
- a second subband estimator for estimating the subband acoustic transfer function, the second subband estimator being applied to the plurality of subband reference signals; and
- an adjustor for adjusting the subband adaptive filter in response to the plurality of subband primary signals and the plurality of estimated subband reference signals; and a synthesis filterbank for transferring the plurality subband output signals into a time-domain output signal.

4. A system for active noise cancellation, comprising:
a first analysis filterbank for transferring a primary signal in a time-domain into a plurality of subband primary signals in a frequency-domain;
a second analysis filterbank for transferring a reference signal in the time-domain into a plurality of subband reference signals in the frequency-domain;
a time-domain adaptive filter for providing a time-domain output signal in response to the reference signal in the time-domain;
a feed-back loop for reconstructing the time-domain adaptive filter, including:
- a time-domain estimator for an acoustic transfer function, the acoustic transfer function modelling conversion of an electrical signal into an acoustic domain signal, the time-domain estimator being applied to the time-domain output signal,
- a signal path for providing the reference signal in the time-domain in response to the primary signal in the time-domain and the estimated time-domain output signal,
- a subband estimator for the acoustic transfer function, the subband estimator being applied to the plurality of subband reference signals, and
- an adjustor for adjusting a subband adaptive filter in response to the plurality of subband primary signals and the plurality of estimated reference signal, and
- a synthesis filterbank for synthesizing the time-domain adaptive filter from the subband adaptive filter.

5. A system as claimed in claim 1, wherein the system is implemented by an over-sampled filterbank.

6. A system as claimed in claim 1, wherein the system is implemented by a WOLA filterbank.

7. A system for active noise cancellation, comprising:
an analog active noise cancellation (ANC) system for performing an active noise cancellation to a primary signal in a time-domain, the primary signal being associated with an acoustic signal and comprising noise;
a first over-sampled analysis filterbank for transferring a reference signal in the time-domain into a plurality of subband reference signals in a frequency-domain, the reference signal in the time-domain being associated with the noise;
a second over-sampled analysis filterbank for transferring the primary signal in the time-domain into a plurality of subband primary signals in the frequency-domain;
a time-domain adaptive filter for providing a time-domain output signal in response to the reference signal in the time-domain;
a subband processing module for processing the plurality of subband reference signals, the plurality of subband primary signals or a combination thereof, including detecting the analog ANC system at brink of instability, and adjusting one or more parameters of the analog ANC system based on the processing; the subband processing module comprising:
- a subband estimator for estimating a subband acoustic transfer function, the subband acoustic transfer function modelling conversion of an electrical signal into an acoustic domain signal, the subband estimator being applied to the plurality of subband reference signals;
- a subband adaptive filter for providing a plurality of subband output signals in response to the plurality of subband reference signals;
- an adjustor for adjusting the subband adaptive filter in response to the plurality of subband primary signals and the plurality of estimated subband reference signals;
an over-sampled synthesis filterbank for synthesizing the time-domain adaptive filter from the subband adaptive filter.

8. A system as claimed in claim 7, wherein the first over-sampled analysis filterbank is implemented by a first WOLA analysis filterbank, or the second over-sampled analysis filterbank is implemented by a second WOLA analysis filterbank, or a combination thereof.

9. A system as claimed in claim 8, wherein the subband processing module implements one or more than one subband adaptive algorithm.

10. A system as claimed in claim 8, wherein the subband processing module is provided for implementing one or more than one delayless subband adaptive algorithm.

11. A system as claimed in claim 7, wherein:
the over-sampled synthesis filterbank comprises a WOLA synthesis filterbank for converting a plurality of subband adaptive filters into a time-domain filter.

12. A system as claimed in claim 11, wherein a time-domain output signal is provided by the output of the time-domain filter or a combination of the output of the time-domain filter and the primary signal.

13. A system as claimed in claim 11, wherein:
a time-domain output signal is provided by the output of the time-domain filter and the primary signal, and
the time-domain output signal is provided to the second over-sampled analysis filterbank.

14. A system as claimed in claim 7, wherein the subband processing module is adaptive or re-programmable, and models one or more than one subband transfer function associated with an application of a listening device.

15. A system as claimed in claim 1, wherein the adjustor implements NMSL adaptation algorithm.

16. A system as claimed in claim 7, wherein the adjustable parameters of the analog ANC system include loop-filter frequency, loop-gain, similar parameters or combinations thereof.

17. A system as claimed in claim 7, wherein the subband processing module is capable of modeling one or more than one acoustic transfer function, a transfer function for a microphone, a transfer function for a loudspeaker, or combinations thereof.

18. A system as claimed in claim 3, wherein the system is implemented by an over-sampled filterbank.

19. A system as claimed in claim 3, wherein the system is implemented by a WOLA filterbank.

20. A system as claimed in claim 4, wherein the system is implemented by an over-sampled filterbank.

21. A system as claimed in claim 4, wherein the system is implemented by a WOLA filterbank.

22. A system as claimed in claim 9, wherein the subband adaptive algorithm includes Filtered-X LMS (FX-LMS) algorithm.

23. A system as claimed in claim 10, wherein the delayless subband adaptive algorithm includes delayless Filtered-X LMS (FX-LMS) algorithm.

24. A system as claimed in claim 3, wherein the adjustor implements NMSL adaptation algorithm.

25. A system as claimed in claim 4, wherein the synthesis filterbank comprises a WOLA synthesis filterbank implementing a sequential synthesis or batch synthesis for reconstruction of the time-domain filter based on the plurality of subband adaptive filters.

* * * * *